(12) United States Patent
Shibata et al.

(10) Patent No.: US 6,172,405 B1
(45) Date of Patent: Jan. 9, 2001

(54) SEMICONDUCTOR DEVICE AND PRODUCTION PROCESS THEREFORE

(75) Inventors: Akihide Shibata; Hiroshi Iwata, both of Nara (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/354,842

(22) Filed: Jul. 16, 1999

(30) Foreign Application Priority Data

Jul. 17, 1998 (JP) .................................................. 10-203387

(51) Int. Cl.$^7$ .................................................. H01L 29/72
(52) U.S. Cl. .................... 257/371; 257/372; 257/379; 257/533; 257/536
(58) Field of Search ................... 257/371, 372, 257/379, 533, 536

(56) References Cited

U.S. PATENT DOCUMENTS 5,786,722 * 7/1998 Buhler et al. .................... 257/533

FOREIGN PATENT DOCUMENTS 6085262    3/1994 (JP) .
10163342   6/1998 (JP) .

* cited by examiner

Primary Examiner—Edward Wojciechowicz

(57) ABSTRACT

A semiconductor device includes: a semiconductor substrate; a well region of a first conductivity type formed; a well region of a second conductivity type; a trench isolation region; a source region and a drain region of the first conductivity type; a channel region formed; a gate insulating film; and a gate electrode being electrically connected to the well region of the second conductivity type, wherein the product τ, i.e., CR, of an electrical resistance R of the well region of the second conductivity type and the sum C of junction capacitances between the well region of the second conductivity type and the source region and between the well region of the second conductivity type and the drain region, a junction capacitance between the well region of the second conductivity type and the well region of the first conductivity type and an electrostatic capacitance between the well region of the second conductivity type and an inversion layer formed in the channel region is $5 \times 10^{-11}$ seconds or less.

17 Claims, 29 Drawing Sheets

SEMICONDUCTOR DEVICE AND PRODUCTION PROCESS THEREFORE

CROSS-REFERENCE TO RELATED APPLICATION

This application is related to Japanese application No. HEI 10(1998)-203387 filed on Jul. 17, 1998, whose priority is claimed under 35 USC §119, the disclosure of which is incorporated by reference in its entirety.

BACKGROUND OF THE INVENTION

1. Field of the Invention

The present invention relates to a semiconductor device and a production process therefor. More particularly, the invention relates to a semiconductor device such as a dynamic threshold voltage transistor in which a gate electrode is connected to a well region and a production process therefor.

2. Description of Related Art

For reducing power consumed by a CMOS circuit using a MOSFET, decreasing supply voltage is one of the most effective means. However, if the supply voltage is simply decreased, a driving current for the MOSFET declines and the operating speed of the circuit slows. It is known that this phenomenon becomes notable where the supply voltage becomes lower than the triple of the threshold voltage of a transistor.

In order to prevent this phenomenon, the threshold voltage may be lowered. However, a decline in the threshold voltage may give rise to a problem that leakage current when the MOSFET is off (also referred to as off-leak hereinafter) increases. For this reason, the lower limit of the threshold voltage is restricted within such a range that this problem does not occur. Such restriction to the lower limit of the threshold voltage also sets limits to reduction of power consumption since it corresponds to the lower limit of the supply voltage.

In order to provide relief from this problem, conventionally proposed is a dynamic threshold voltage MOSFET (DTMOS) using an SOI substrate which allows a high driving current to be produced from a low supply voltage by reduction of an effective threshold when the MOSFET is on (A Dynamic Threshold Voltage MOSFET (DTMOS) for Ultra-Low Voltage Operation by F. Assaderaghi et al., IEDM94 Ext. Abst. P.809(1994)). Also proposed are dynamic threshold voltage transistors without using the expensive SOI substrate but using bulk substrates (Japanese Unexamined Patent Publication No. HEI 10(1998)-22462 and Novel Bulk Threshold Voltage MOSFET (B-DTMOS) with Advanced Isolation (SITOS) and Gate to Shallow Well Contact (SSS-C) Processes for Ultra Low Power Dual Gate CMOS by H. Kotaki et al., IEDM Tech. Dig., p.459, 1996). Both the MOSFETS can reduce the effective threshold voltage when they are on, because gate electrodes and substrates (or well regions) are electrically short-circuited.

FIGS. 27(a) and 27(b) show N-type dynamic threshold voltage transistors using the former SOI substrate. FIG. 27(a) shows a transistor of a complete depletion type and FIG. 27(b) shows a transistor of a partial depletion type. In the figures, reference numeral 111 denotes a substrate, 112 denotes a buried oxide film layer, 113 denotes a body, 114 denotes a source region, 115 denotes a drain region, 116 denotes a gate insulating film, and 117 denotes a gate electrode. The gate electrode 117 is electrically connected to the p-type body 113 via a contact hole, though not shown.

Here, the complete depletion means that the body is completely depleted beneath the gate electrode and the partial depletion means that the body is partially undepleted beneath the gate electrode. It is noted that P-type transistors can be formed by reversing polarity (a type of conductivity) shown in the figures.

FIG. 28 shows an N-type dynamic threshold voltage transistor using the latter bulk substrate. It is noted that a P-type transistor can be formed by reversing the polarity (a type of conductivity) shown in the figure. In the figure, reference numeral 211 denotes a substrate, 212 denotes an N-type well region (a deep well region), 213 denotes a P-type well region (a shallow well region), 214 denotes a buried high-concentration region, 215 denotes a trench isolation region, 216 denotes a source region, 217 denotes a drain region, 218 is a gate insulating film and 219 denotes a gate electrode. The gate electrode 219 is electrically connected to the shallow well region 213 via a contact hole though this connection is not shown. A transistor formed in a single shallow well region is simply referred to as a device hereinafter.

Now explanation is given to the principle of operation of the dynamic threshold voltage transistor using the bulk substrate. It is noted that the transistor using the SOI substrate also operates on substantially the same principle. In the above-mentioned transistor, when the potential of the gate electrode is at a low level (when the transistor is off), the potential of the shallow well region is also at a low level. Accordingly, the effective threshold voltage does not differ from that of a common MOSFET, and the value of leakage current is the same as that of the common MOSFET.

When the potential of the gate electrode is at a high level (when the transistor is on), the potential of the shallow well region is also at a high level. The effective threshold voltage decreases due to a substrate bias effect and the driving current increases as compared with the common MOSFET. Therefore, a large driving current can be obtained at a low supply voltage while a low leakage current is maintained.

Next, explanation is given to device isolation with the dynamic threshold voltage transistor using the bulk substrate. The potential in the shallow well region varies depending on the potential of the gate electrode. For this reason, a trench isolation region is formed between devices for isolating them to prevent interference therebetween. The depth of the trench isolation region is set such that the shallow well regions of adjacent devices are electrically separated. That is, the depth of the trench isolation region is so set that a depletion layer extending from a junction of the shallow well region and the deep well region does not contact to a depletion layer extending from a junction of the shallow well region with the deep well region of the adjacent device.

For making the most of the substrate bias effect and realizing a high-speed operation, a change in the potential of the gate electrode must be transmitted to the shallow well region quickly. For this purpose, the buried high-concentration region is constructed to be sandwiched by regions having low impurity concentrations, in FIG. 28. This construction enables electrical resistance in the shallow well region to decrease and a change in the potential of the gate electrode to be transmitted to the shallow well region immediately. At the same time, since the impurity concentration in a channel region can be reduced, a low threshold can be realized and a junction capacitance between the source region and the shallow well region and a junction capacitance between the drain region and the shallow well region can be kept small.

As described above, in operation of the dynamic threshold voltage transistor, a change in the potential of the gate electrode is required to be transmitted to the shallow well region quickly. Time necessary for this transmission is explained with use of FIGS. 29(a) and 29(b). FIG. 29(a) is a schematic diagram of a dynamic threshold voltage transistor using a bulk substrate and FIG. 29(b) is an equivalent circuit diagram thereof. In the figures, reference numeral 311 denotes a deep well region, 312 denotes a shallow well region, 313 denotes a source region, 314 denotes a drain region, 315 denotes a gate insulating film, 316 denotes a gate electrode, 317 denotes a gate input terminal, 318 denotes a depletion layer region extending from a junction of the source region and the shallow well region, 319 denotes a depletion layer region extending from a junction of the drain region with the shallow well region, 320 denotes a gate depletion layer region, 321 denotes a depletion layer region extending from a junction of the shallow well region and the deep well region, 322 denotes a source input terminal, 323 denotes a drain input terminal, 324 denotes a terminal of the deep well region, 325 denotes a charge inversion layer, 326 denotes the capacitance of the depletion layer extending from the junction of the source region and the shallow well region, 327 denotes the capacitance of the depletion layer extending from the junction of the drain region and the shallow well region, 328 denotes the capacitance of the gate depletion layer, 329 denotes the capacitance of the gate, 330 denotes the capacitance of the depletion layer extending from the junction of the shallow well region and the deep well region, 331 denotes the resistance of the shallow well region, and 332 denotes the resistance of the gate electrode. It is noted that a device isolation region is not shown in these figures.

Time $\tau$ which is necessary for a potential given to the gate input terminal 317 to be transmitted to the shallow well region is represented by the following formulae:

$$\tau = CR$$

$$C = Cs + Cd + Cdep + Csw/dw$$

, wherein C is the sum of the junction capacitance Cs between the source region and the shallow well region (body), the junction capacitance Cd between the drain region and the shallow well region (body), the capacitance Cdep of the gate depletion layer, and the junction capacitance Csw/dw between the shallow well region and the deep well region (only in the case of a dynamic threshold voltage transistor using a bulk substrate), and R is the resistance of the shallow well region (body). Besides, the time necessary for charging the capacitance Cg of the gate is represented by the product of the capacitance Cg, and resistance Rg of the gate and is usually shorter than $\tau$.

Time $\tau$ must be sufficiently shorter than the time necessary for having charged the capacitance for the next stage when the transistor becomes on. In other words, it must be sufficiently shorter than the sum of time constants related to the capacitance of the gate, the capacitance of wiring and the like. If this condition is not satisfied, the operation speed of the circuit declines considerably because a sufficient substrate bias effect is not obtained before the switching of operation is finished.

The above-described dynamic threshold voltage transistor using an SOI substrate is said to have a problem that its body has a high resistance. In the case of the complete depletion type, the body is so thin, say 30 nm, that it is impossible to adjust the threshold by raising the impurity concentration in the body for the purpose of reducing the resistance of the body. On the other hand, in the case of the partial depletion type, the body has a relatively large thickness, say 100 to 150 nm. However, even if the impurity concentration in the body is raised to $1\times10^{18}$ cm$^{-3}$, $\tau$ is about $1\times10^{-10}$ sec supposing C is $1\times10^{-15}$ F, in the case of a device having a gate length of 0.18 $\mu$m and a gate width of 1.8 $\mu$m, for example. This $\tau$ is large as compared with other delay factors and therefore the substrate bias effect can hardly be obtained. In addition, when the impurity concentration in the body is high, the depletion layers extending from the junctions with the source region and with the drain region do not contact the buried oxide film layer, and therefore the junction capacitances increase greatly. If the junctions of the source and drain regions with the body are located deeper with a view to preventing this, a short-channel effect increases considerably.

For these reasons, it is difficult to obtain a sufficiently short $\tau$ with the dynamic threshold voltage transistor using the SOI substrate.

On the other hand, in the case of the dynamic threshold voltage transistor using a bulk substrate (hereafter referred to as a B-DTMOS), no limit is placed on the depth of the shallow well region. Accordingly, if a high-concentration impurity layer is formed at a sufficiently deep location, the resistance of the shallow well region can be reduced without giving any effect on the impurity concentration in the channel region. Thereby $\tau$ can be sufficiently decreased.

Clearly, in order to reduce the resistance of the shallow well region, the dose of implanted impurity may be increased. However, it has been found that the leakage current when the transistor is off increases rapidly as the implantation dose is increased.

FIG. 5 represents an Id (drain current)–Vg (gate voltage) characteristic of an N-type B-DTMOS produced under the following implantation conditions of shallow well region: An impurity ion species of $^{11}$B$^+$; an implantation energy of 250 KeV; and an implantation dose of $1\times10^{14}$ cm$^{-2}$. In this case, the off-leak is $9\times10^{-10}$ A/$\mu$m of gate width. Where the supply voltage is 0.5V, the ratio of the driving current to the off-leak current is about $10^4$. This current ratio is far from a standard requisite for a power-saving device, $10^5$.

Thus, in a method wherein the implantation dose of the impurity is increased for reducing the resistance of the shallow well region and improving the speed of transmission of a change in the potential of the gate electrode, there arises a problem that the off-leak increases. In addition to that, because a depletion layer extending from the shallow well region and the deep well region becomes deeper, there arises a problem that the trench device isolation region must be deepened.

SUMMARY OF THE INVENTION

Under the above-described circumstances, an object of the present invention is to provide a semiconductor device capable of proving a sufficient substrate bias effect and thereby operating at a high speed whose off-leak is within an acceptable range and to provide a process for producing such semiconductor device.

The present invention provides a semiconductor device comprising a semiconductor substrate; a well region of a first conductivity type formed in the semiconductor substrate; a well region of a second conductivity type formed in the semiconductor substrate and on the well region of the first conductivity type; a trench isolation region for electrically separating the well region of the second conductivity type from an adjacent well region of the second conductivity type; a source region and a drain region of the first conductivity type formed in a surface layer of the well region of the second conductivity type; a channel region formed between the source region and the drain region; a gate insulating film formed on the channel region; and a gate electrode formed on the gate insulating film, being electrically connected to the well region of the second conductivity type, wherein the product τ, i.e., CR, of an electrical resistance R of the well region of the second conductivity type and the sum C of junction capacitances between the well region of the second conductivity type and the source region and between the well region of the second conductivity type and the drain region, a junction capacitance between the well region of the second conductivity type and the well region of the first conductivity type and an electrostatic capacitance between the well region of the second conductivity type and an inversion layer formed in the channel region is $5\times10^{-11}$ seconds or less.

The present invention also provides a semiconductor device comprising a semiconductor substrate; a well region of a first conductivity type formed in the semiconductor substrate; a well region of a second conductivity type formed in the semiconductor substrate and on the well region of the first conductivity type; a trench isolation region for electrically separating the well region of the second conductivity type from an adjacent well region of the second conductivity type; a source region and a drain region of the first conductivity type formed in a surface layer of the well region of the second conductivity type; a channel region formed between the source region and the drain region; a gate insulating film formed on the channel region; and a gate electrode formed on the gate insulating film, being electrically connected to the well region of the second conductivity type, wherein the well region of the second conductivity type has a sheet resistance of 10 KΩ/□ or less.

In another aspect, the present invention provides a process for producing a semiconductor device as set forth in claim 1, wherein a well region of a second conductivity type is formed by an ion implantation step and a thermal treatment step for activating implanted impurity ions, (1) the ion implantation step is carried out, after formation of a trench isolation region and before formation of a gate insulating film, under conditions of an implantation energy of 60 KeV to 500 KeV and an implantation dose less than $1\times10^{14}$ cm$^{-2}$ in the case where $^{11}$B$^+$ ions are implanted as impurity ions of the second conductivity type, or under conditions of an implantation energy of 130 KeV to 900 KeV and an implantation dose less than $1\times10^{14}$ cm$^{-2}$ in the case where $^{31}$P$^+$ ions are implanted as impurity ions of the second conductivity type, and (2) the thermal treatment step is carried out simultaneously with a thermal treatment at formation of the gate insulating film and with a thermal treatment at formation of a source region and a drain region.

The present invention also provides a process for producing a semiconductor device as set forth in claim 1, wherein a well region of a second conductivity type is formed by an ion implantation step and a thermal treatment step for activating implanted impurity ions, (1) both the ion implantation step and the thermal treatment step are carried out after formation of a trench isolation region and before formation of a gate insulating film, the ion implantation step is carried out under conditions of an implantation energy of 60 KeV to 500 KeV and an implantation dose less than $2\times10^{14}$ cm$^{-2}$ in the case where $^{11}$B$^+$ ions are implanted as impurity ions of the second conductivity type, or under conditions of an implantation energy of 130 KeV to 900 KeV and an implantation dose less than $2\times10^{14}$ cm$^{-2}$ in the case where $^{31}$P$^+$ ions are implanted as impurity ions of the second conductivity type, and (2) the thermal treatment step is carried out at a temperature of 900° C. to 1,100° C.

Further, the present invention provides a process for producing a semiconductor device as set forth in claim 1, wherein a well region of a second conductivity type is formed by an ion implantation step and a thermal treatment step for activating implanted impurity ions, (1) the ion implantation step is carried out, before formation of a trench isolation region, under conditions of an implantation energy of 60 KeV to 500 KeV and an implantation dose less than $4\times10^{14}$ cm$^{-2}$ in the case where $^{11}$B$^+$ ions are implanted as impurity ions of the second conductivity type, or under conditions of an implantation energy of 130 KeV to 900 KeV and an implantation dose less than $4\times10^{14}$ cm$^{-2}$ in the case where $^{31}$P$^+$ ions are implanted as impurity ions of the second conductivity type, and (2) the thermal treatment step is carried out simultaneously with a thermal treatment at formation of the trench isolation region which is carried out at a temperature of 1,000° C. to 1,150° C.

Still further the present invention provides a process for producing a semiconductor device as set forth in claim 1, wherein a well region of a second conductivity type is formed by an ion implantation step and a thermal treatment step for activating implanted impurity ions, (1) the ion implantation step is carried out, before formation of a trench isolation region, under conditions of an implantation energy of 60 KeV to 500 KeV and an implantation dose less than $1\times10^{14}$ cm$^{-2}$ in the case where $^{11}$B$^+$ ions are implanted as impurity ions of the second conductivity type, or under conditions of an implantation energy of 130 KeV to 900 KeV in an implantation dose less than $1\times10^{14}$ cm$^{-2}$ in the case where $^{31}$P$^{30}$ ions are implanted as impurity ions of the second conductivity type, and (2) the thermal treatment step is carried out simultaneously with a thermal treatment at formation of the trench isolation region which is carried out at a temperature of 800° C. to 1,000° C.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
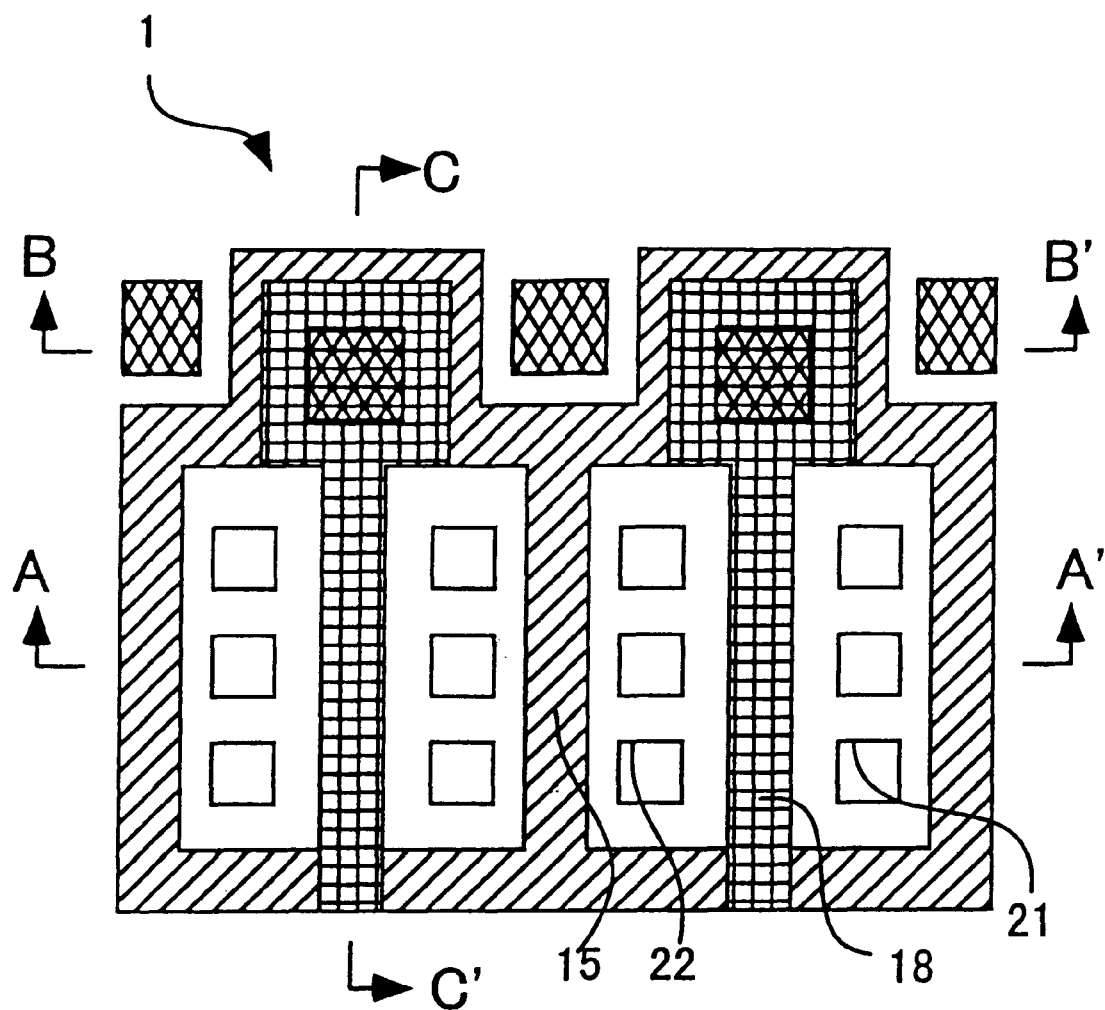
FIG. 1 is a plan view illustrating a semiconductor device produced by a production process in accordance with Embodiment 1 of the present invention.

In this specification, the first conductivity type means a P-type or a N-type, and the second conductivity type means the N type where the first conductivity type is the P-type and means the P-type where the first conductivity type is the N-type.

A semiconductor substrate usable in the present invention is not particularly limited, but a silicon substrate is preferred. The semiconductor substrate may have a P-type or N-type conductivity.

Trench Isolation Region

An isolation region in the form of a trench is formed on the substrate for electrically isolating adjacent well regions of the second conductivity type from each other. Here, the trench isolation region may be an isolation region formed by a LOCOS method or a shallow trench isolation (STI) region. Materials which may be buried in the trench region are not limited to oxides, but may be any materials that can isolate adjacent well regions of the second conductivity type electrically from each other, for example, a polysilicon coated with an oxide film. The trench isolation region may be a combination of isolation regions of different types of different materials. The isolation region of STI is usually formed by forming a trench in a semiconductor substrate, filling the trench with a material by a bias chemical vapor deposition (CVD) method and flattening the surface of the substrate by a chemical mechanical polishing (CMP) method.

This trench isolation region may be formed before a first-conductivity-type well region and a second-conductivity-type well region are formed, after the first-conductivity-type well region is formed but before the second-conductivity-type well region is formed, after the second-conductivity-type well region is formed but before the first-conductivity-type well region is formed or after the first-conductivity-type well region and the second-conductivity-type well region are formed. These first- and second-conductivity-type well regions are described below.

In this specification, since the second-conductivity-type well region is formed less deep than the first-conductivity-type well region with respect to the surface of the substrate, the second-conductivity-type well region is also referred to as a shallow well region and the first-conductivity type well region as a deep well region.

A thermal treatment (including oxidation) in the process of forming the trench isolation region may be carried out at a temperature of 800 to 1,150° C.

Deep Well Region

Next, the deep well region of the first conductivity type is formed in the semiconductor substrate. As impurity ions for forming a P-type region, $^{11}B^+$ may be mentioned and as impurity ions for forming an N-type region, $^{31}P^+$ may be mentioned. For example, in the case where $^{11}B^+$ ions are used as impurity ions, the deep well region may be formed under conditions of an implantation energy of 100 to 400 KeV and a dose of $3 \times 10^{12}$ to $1 \times 10^{14}$ cm$^{-2}$. In the case where $^{31}P^+$ ions are used as impurity ions, the deep well region may be formed under conditions of an implantation energy of 240 to 750 KeV and a dose of $3 \times 10^{12}$ to $1 \times 10^{14}$ cm$^{-2}$.

Shallow Well Region

The shallow well region of the second conductivity type is formed on the deep well region of the first conductivity type in an area less deep with respect to the surface of the substrate.

The shallow well region is so formed that the time $\tau=CR$ necessary for a potential provided to the gate electrode to be transmitted to the shallow well region is $5 \times 10^{-11}$ seconds or less, preferably $6 \times 10^{-12}$ to $5 \times 10^{-11}$ seconds. Here, C means the sun of the junction capacitance between the shallow well region and the source region, the junction capacitance between the shallow well region and the drain region, the junction capacitance between the shallow well region and the deep well region, and the electrostatic capacitance between the shallow well region and an inversion layer formed in the channel region. The R means an electrical resistance of the shallow well region.

With this construction, a sufficient substrate bias effect can be obtained at the operation of the dynamic threshold voltage transistor using the bulk substrate, and a power-saving high-speed CMOS circuit can be realized. Also an LSI for a power saving purpose can be operated at a sufficient speed without need to raise the impurity concentration in the shallow well region excessively. As a result, the off-leak current may be suppressed. In other words, the impurity concentration in the shallow well region may be designed optimally.

Alternatively, the shallow well region is so formed that its sheet resistance is 10 KΩ/□ or less, preferably 300 Ω/□ to 10 KΩ/□.

With this construction, a sufficient substrate bias effect can be obtained at the operation of the dynamic threshold voltage transistor using the bulk substrate, and a power-saving high-speed CMOS circuit can be realized.

More particularly, if the gate length is 0.18 μm, the gate width is 1.8 μm, the width of the source and drain regions is 0.51 μm and the impurity concentration is $5 \times 10^{17}$ cm$^{-3}$ at proximity of the junctions of the source and drain regions with the shallow well region, for example, C is about $5.3 \times 10^{-15}$F. Therefore, the resistance R of the shallow well region needs to be about 9.4 KΩ or less (about 940 Ω/□ or less in terms of the sheet resistance). Here, if the impurity concentration is constant in any part of the shallow well region and the thickness of the shallow well region is $5 \times 10^{-7}$ m, the resistivity needs to be $3.1 \times 10^{-3}$ Ωm or less. At this time, if the impurity is B (the shallow well region is of the P type), its concentration is about $9 \times 10^{16}$ cm$^{-3}$ or more, and if the impurity is P (the shallow well region is of the N type), its concentration is about $2 \times 10^{16}$ cm$^{-3}$ or more. In practical devices, since the impurity concentration in the shallow well region is not constant, the impurity concentration averaged in the direction of depth should satisfy the above-described condition.

Also, for example, if the gate length is 0.18 μm, the gate width is 1.8 μm, the width of the source and drain regions is 0.12 μm and the impurity concentration is $5 \times 10^{17}$ cm$^{-3}$ at proximity of the junctions of the source and drain regions with the shallow well region, C is about $1.9 \times 10^{-15}$F. Therefore, the resistance R of the shallow well region needs to be about 26 KΩ or less (about 2.6 KΩ/□ or less in terms of the sheet resistance). Here, if the impurity concentration is constant in any part of the shallow well region and the thickness of the shallow well region is $5 \times 10^{-7}$ m, the resistivity must be $1.1 \times 10^{-3}$ Ωm or less. At this time, if the impurity is B (the shallow well region is of the P type), its concentration is about $5 \times 10^{17}$ cm$^{-3}$ or more, and if the impurity is P (the shallow well region is of the N type), its concentration is about $8 \times 10^{16}$ cm$^{-3}$ or more. In practical devices, since the impurity concentration in the shallow well region is not constant, the concentration averaged in the direction of depth should satisfy the above-described condition.

Also, for example, if the gate length is 0.25 μm, the gate width is 1.5 μm, the width of the source and drain regions is 0.17 μm and the impurity concentration is $1 \times 10^{17}$ cm$^{-3}$ at proximity of the junctions of the source and drain regions with the shallow well region, C is about $9 \times 10^{-16}$F. Therefore, the resistance R of the shallow well region needs to be about 56 KΩ or less (about 9.3 KΩ/□ or less in terms of the sheet resistance). Here, if the impurity concentration is constant in any part of the shallow well region and the thickness of the shallow well region is $5 \times 10^{-7}$ m, the resistivity needs to be $1.1 \times 10^{-3}$ Ωm or less. At this time, if the impurity is B (the shallow well region is of the P type), its concentration is about $5 \times 10^{17}$ cm$^{-3}$ or more, and if the impurity is P (the shallow well region is of the N type), its concentration is about $8 \times 10^{16}$ cm$^{-3}$ or more. In practical devices, since the impurity concentration in the shallow well region is not constant, the concentration averaged in the direction of depth should satisfy the above-described condition.

The shallow well region is formed through the ion implantation step and the thermal treatment step for activating the implanted impurity ions. As conditions to forming the shallow well region, the following four conditions may be mentioned.

(1) The ion implantation step may be carried out, after the trench isolation region is formed but before the gate insulating film is formed, at an implantation energy of 60 to 500 KeV at a dose less than $1 \times 10^{14}$ cm$^{-2}$ if the impurity ions of the second conductivity type are $^{11}B^+$ ions, or at an implantation energy of 130 to 900 KeV at a dose less than $1 \times 10^{14}$ cm$^{-2}$ if the impurity ions of the second conductivity type are $^{31}P^+$ ions; and the thermal treatment step may be carried out simultaneously with a thermal treatment at the formation of the gate insulating film and with a thermal treatment at the formation of the source and drain regions.

(2) The ion implantation step may be carried out at an implantation energy of 60 to 500 KeV at a dose less than $2 \times 10^{14}$ cm$^{-2}$ if the impurity ions of the second conductivity type are $^{11}B^+$ ions, or at an implantation energy of 130 to 900 KeV at a dose less than $2 \times 10^{14}$ cm$^{-2}$ if the impurity ions of the second conductivity type are $^{31}P^+$ ions; the thermal treatment step may be carried out at a temperature of 900 to 1,100° C.; and both the steps may be carried out after the trench isolation region is formed but before the gate insulating film is formed.

(3) The ion implantation step may be carried out, before the trench isolation region is formed, at an implantation energy of 60 to 500 KeV at a dose less than $4 \times 10^{14}$ cm$^{-2}$ if the impurity ions of the second conductivity type are $^{11}B^+$ ions, or at an implantation energy of 130 to 900 KeV at a dose less than $4 \times 10^{14}$ cm$^{-2}$ if the impurity ions of the second conductivity type are $^{31}P^+$ ions; and a thermal treatment step may be carried out simultaneously with the thermal treatment at the formation of the trench isolation region which is carried out at a temperature of 1,000 to 1,150° C.

(4) The ion implantation step may be carried out, before the trench isolation region is formed, at an implantation energy of 60 to 500 KeV at a dose less than $1\times10^{14}$ cm$^{-2}$ if the impurity ions of the second conductivity type are $^{11}B^+$ ions, or at an implantation energy of 130 to 900 KeV at a dose less than $1\times10^{14}$ cm$^{-2}$ if the impurity ions of the second conductivity type are $^{31}P^+$ ions; and the thermal treatment step may be carried out simultaneously with a thermal treatment at the formation of the trench isolation region which is carries out at a temperature of 800 to 1,000° C.

By selecting the ion dose and the implantation energy for forming the shallow well region, as described above, damage to the crystal of the semiconductor substrate may be inhibited. In addition to that, the degree of recovery from crystal defects varies depending on the temperature at the thermal treatment step after the ion implantation. Therefore, if the thermal treatment is carried out at a higher temperature, the upper limit to the implantation dose may be raised. It is noted that the lower limit to the implantation energy is so set that a punch-through between the deep well region and the source and drain regions is prevented.

The above-described formation of the shallow well region can suppress reverse and forward leakage currents which occurs at PN junctions. For this reason, the off-leak in N-type and P-type transistors can be suppressed and a low threshold voltage necessary for low-voltage operation can be realized.

According to condition (1), it is possible to suppress the off-leak of the device within a permissible range. Further the thermal treatment step which is conducted after the ion implantation for forming the shallow well region can be combined with the step of for forming the gate insulating film and with an annealing step for activating impurity ions at the formation of the source and drain regions. Accordingly the production process can be simplified. Furthermore, since the shallow well region can be formed by conducting as few thermal treatments as possible, extension of implantation profile due to diffusion of impurity ions can be minimized.

Especially in the N-type device, it is possible to minimize the phenomenon that the impurity (e.g., boron) concentration in the shallow well region decreases near the oxide film composing the trench isolation region. Accordingly, the punch-through between the source and drain regions and the deep well region near the trench isolation region can be suppressed effectively. Therefore, it is possible to minimize the depth of the trench isolation region. This is because of the following reason: If the boron concentration in the shallow well region decreases near the oxide film composing the trench isolation region, a depletion layer extending from the junction of the shallow well region and the source and drain regions expands toward the deep well region; accordingly, the depletion layer extending from the junction of the shallow well region and the source and drain regions must be formed so deep that the shallow well region does not contact the junction depletion layer extending from the junction of the shallow well region and the deep well regions. That gives a rise to a need to deepen the trench isolation region for separating shallow well regions device by device.

According to the above-mentioned condition (1), since the trench need not be formed deep and therefore it is easy to fill the trench with a material, a trench isolation region of STI can easily formed.

According to condition (2), since the thermal treatment for forming the shallow well region is carried out independently, lattice defects caused by the ion implantation for forming the shallow well region are repaired. As a result, the off-leak can be reduced. According to condition (2), the upper limit to the ion dose in the shallow well region can be doubled as compared with condition (1). Thereby, since the resistance of the shallow well region can be further reduced, it becomes possible to provide an LSI capable of high-speed operation.

According to condition (3), since the ion implantation for the shallow well region is carried out before the thermal treatment at 1,000 to 1,150° C. for forming the trench isolation region, the impurity profile in the direction of the depth of the shallow well region maybe nearly flat. As a result, it becomes easier to control the impurity concentration in the channel region for controlling the threshold voltage. Also, since the thermal treatment for diffusing the impurity at a high temperature is carried out, the lattice defects due to the implantation of the impurity ions can be remarkably recovered and it becomes possible to reduce the off-leak. Condition (3) can quadruple the upper limit to the dose of ions in the shallow well region as compared with condition (1). Thereby, since the resistance of the shallow well region can be more reduced, it becomes possible to provide an LSI capable of high-speed operation. Further, since the thermal treatments for the shallow well region and for the trench isolation region are simultaneously performed, the production process can be simplified and as a result the production cost can be reduced.

According to condition (4), since the ion implantation for the shallow well region can be carried out before the thermal treatment at 800 to 1,000° C. for forming the trench isolation region, the diffusion of the impurity in the shallow well region can be reduced as compared with conditions (3). As a result, it becomes possible to reduce the depth of the trench isolation region and the shallow well region.

Here, as conditions for the above-mentioned ion implantation, an implantation energy of 80 to 340 KeV and a dose of $3\times10^{12}$ to $5\times10^{13}$ cm$^{-2}$ are preferable in the case where $^{11}B^+$ ions are used as impurity ions, and an implantation energy of 200 to 650 KeV and a dose of $3\times10^{12}$ to $5\times10^{13}$ cm$^{-2}$ are preferable in the case where $^{31}P^+$ ions are used as impurity ions.

More particularly, for decreasing the time τ necessary for the potential provided to the gate electrode to be transmitted to the shallow well region to $5\times10^{-11}$ seconds or less, the conditions may be set as follows.

First, the shallow P-type well region of an N-type MOSFET whose C is about $1.9\times10^{-15}F$ may preferably be formed by implanting $^{11}B^+$ ions at a dose of $2.5\times10^{13}$ cm$^{-2}$ or more at an implantation energy of 100 KeV. The shallow N-type well region of an P-type MOSFET whose C is about $1.9\times10^{-15}F$ may preferably be formed by implanting $^{31}P^+$ ions at a dose of $5\times10^{12}$ cm$^{-2}$ or more at an implantation energy of 240 KeV.

Buried High-Concentration Region

Further, a buried high-concentration region may be formed in the shallow well region for reducing the resistance of the shallow well region. The buried high-concentration region may preferably formed in the shallow well region at an implantation energy of 100 to 400 KeV at a dose of $3\times10^{12}$ to $1\times10^{14}$ cm$^{-2}$ in the case where $^{11}B^+$ ions are used as impurity ions, or at an implantation energy of 240 to 750 KeV at a dose of $2\times10^{12}$ to $1\times10^{14}$ cm$^{-2}$ in the case where $^{31}P^+$ ions are used as impurity ions.

Punch-Through Stopper

Further, for preventing the impurity concentration from becoming too low in a surface region of the semiconductor substrate, impurity ions of the same conductivity type of those of the shallow well region may be implanted as a punch-through stopper in the shallow well region. This punch-stopper implantation may be carried out, for example, at an implantation energy of 10 to 60 KeV at a dose of $5\times10^{11}$ to $1\times10^{13}$ cm$^{-2}$ in the case where $^{11}$B$^+$ ions are used as impurity ions, or at an implantation energy of 30 to 150 KeV at a dose of $5\times10^{11}$ to $1\times10^{13}$ cm$^{-2}$ in the case where $^{31}$P$^+$ ions are used as impurity ions.

Gate Insulating Film and Gate Electrode

Next, the gate insulating film and the gate electrode are then formed in this order.

Materials for the gate insulating film are not particularly limited to any kind as far as they are electrically insulative. In the case where the substrate is made of silicon, for example, a silicon oxide film, a silicon nitride film or a laminate thereof may be used as the gate insulating film. The gate insulating film may preferably have a thickness of 1 to 10 nm. The gate insulating film may be formed by a CVD method, a sputtering method, a thermal oxidation method and the like.

Materials for the gate electrode are not particularly limited to any kind as far as they are electrically conductive. In the case where the substrate is made of silicon, for example, a silicon film made of polysilicon, single crystalline silicon or the like may be mentioned. In addition to them, a metal film of aluminum, copper or the like may be mentioned. The gate electrode may preferably have a thickness of 0.1 to 0.4 $\mu$m. The gate electrode may be formed by a CVD method, a sputtering method, a vapor deposition method and the like.

Further, a sidewall spacer may be formed on a side wall of the gate electrode. Materials for the sidewall spacer are not particularly limited. Silicon oxide, silicon nitride and the like may be mentioned as examples thereof.

Source Region and Drain Region

The source region and the drain region of the first conductivity type are formed in a surface layer of the shallow well region.

The source and drain regions may be formed in self-alignment by implanting impurity ions using the gate electrode as a mask. The source and drain regions may be formed, for example, at an implantation energy of 1 to 20 KeV at a dose of $1\times10^{15}$ to $1\times10^{16}$ cm$^{-2}$ in the case where $^{11}$B$^+$ ions are used as impurity ions, or at an implantation energy of 3 to 100 KeV at a dose of $1\times10^{15}$ to $1\times10^{16}$ cm$^{-2}$ in the case where $^{75}$As$^+$ ions are used as impurity ions. A surface layer of the semiconductor substrate beneath the gate electrode functions as a channel region.

Further, the source region and/or the drain region may be provided with an LDD region. The LDD region, for example, may be formed in self-alignment by implanting impurity ions using the gate electrode as a mask. In this case, the source and drain regions may be formed in self-alignment by forming a sidewall spacer on a sidewall of the gate electrode after the formation of the LDD region and implanting ions using the gate electrode and the sidewall spacer as masks. The LDD region may be formed at an implantation energy of 1 to 20 KeV at a dose of $1\times10^{13}$ to $5\times10^{14}$ cm$^{-2}$ in the case where $^{11}$B$^+$ ions are used as impurity ions, or at an implantation energy of 3 to 100 KeV at a dose of $5\times10^{13}$ to $1\times10^{15}$ cm$^{-2}$ in the case where $^{75}$As$^+$ ions are used as impurity ions.

More preferable conditions are an implantation energy of 10 to 20 KeV and a dose of $1\times10^{14}$ to $3\times10^{14}$ cm$^{-2}$ in the case where $^{11}$B$^+$ ions are used as impurity ions, or an implantation energy of 5 to 40 KeV at a dose of $1\times10^{14}$ to $3\times10^{14}$ cm$^{-2}$ in the case where $^{75}$As$^+$ ions are used as impurity ions.

Besides the above-mentioned $^{11}$B$^+$ and $^{75}$As$^+$, it is noted that $^{31}$P$^+$, $^{122}$Sb$^+$, $^{115}$In$^+$, $^{49}$BF$^{2+}$ and the like may be used as impurity ions for forming the source and drain regions and the LDD region.

As a method for forming the source and drain regions, a method for forming the source and drain regions in a stacking manner may also be mentioned. In this case, the source and drain regions may be formed by the following procedure: After the gate electrode is formed, a non-conductive sidewall spacer is formed on a sidewall of the gate electrode, and on a sidewall of the resulting sidewall spacer, a sidewall spacer of polysilicon is further formed. Immediately before the sidewall spacer of polysilicon is formed, the insulating film on regions of the substrate to be the source and drain regions is removed. Since the sidewall spacer of polysilicon, as it is, is in an annular form surrounding the gate electrode, the annulus is cut in at least two positions by etching. Ion implantation for the source and drain region is carried out to where polysilicon remains (the remaining polysilicon separates into at least two portions).

The ion implantation for the source and drain regions, for example, may be carried out, for example, at an implantation energy of 5 to 40 KeV at a dose of $1\times10^{15}$ to $2\times10^{16}$ cm$^{-2}$ in the case where $^{11}$B$^+$ ions are used as impurity ions, at an implantation energy of 10 to 180 KeV at a dose of $1\times10^{15}$ to $2\times10^{16}$ cm$^{-2}$ in the case where $^{75}$As$^+$ ions are used as impurity ions, or at an implantation energy of 5 to 100 KeV at a dose of $1\times10^{15}$ to $2\times10^{16}$ cm$^{-2}$ in the case where $^{31}$P$^+$ ions are used as impurity ions.

Thereafter, annealing for activating the impurity ions may be performed at a suitable temperature for a suitable time to diffuse the impurity in the separate sidewall spacers of polysilicon, and as a result, the source and drain regions are formed.

According to the above-described method, it is possible to form a source region and a drain region which have shallow junctions. That is because the impurity diffuses in polysilicon much faster than in single crystal. Thereby a device having a smaller short channel effect can be easily formed.

Surface layers of the source region, the drain region and the gate electrode of a silicon film may be made into a silicide for the purpose of providing a better conductivity with wires connected thereto. Examples of silicides include tungsten silicide, titanium silicide and the like.

Then, a semiconductor device may be completed by forming a wiring layer and the like by a known technique.

It is noted that, though the cases of single devices have been discussed above for simplicity of explanation, a case of a plurality of devices formed on one substrate is also within the scope of the invention. Where a plurality of devices are formed, constituents of the devices (i.e., the deep well, the shallow well and the like) may the same or different in conductivity type among them. For example, according to the present invention, it is possible to form both NMOSFET and PMOSFET on a substrate such as CMOS.

Embodiment 1

A first embodiment of the present invention is described with reference to FIGS. 1 to 12, as follows.

Construction of Semiconductor Device

Figure 2:
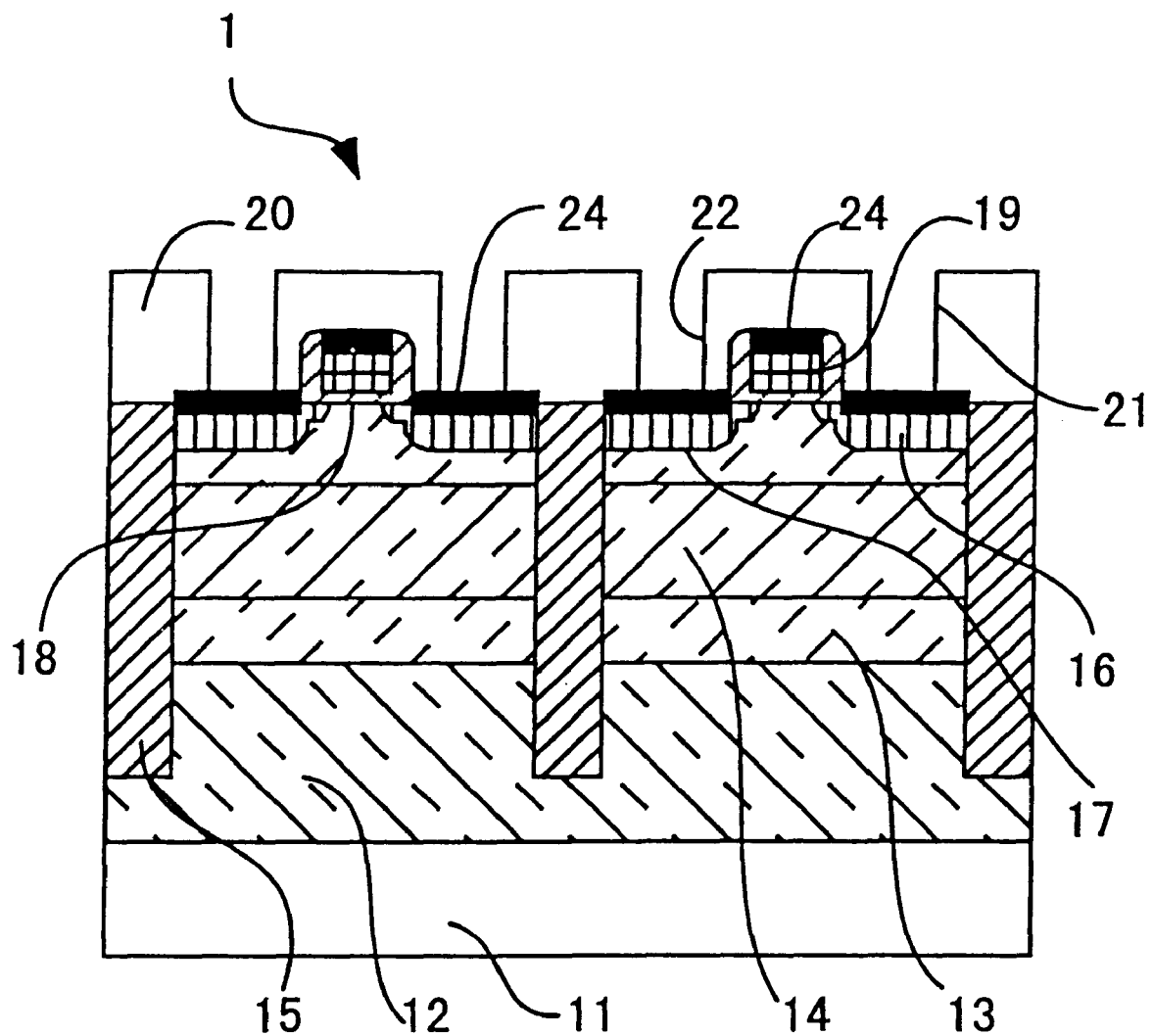
FIG. 2 is a cross-sectional view taken on line A-A' of FIG. 1.
Figure 3:
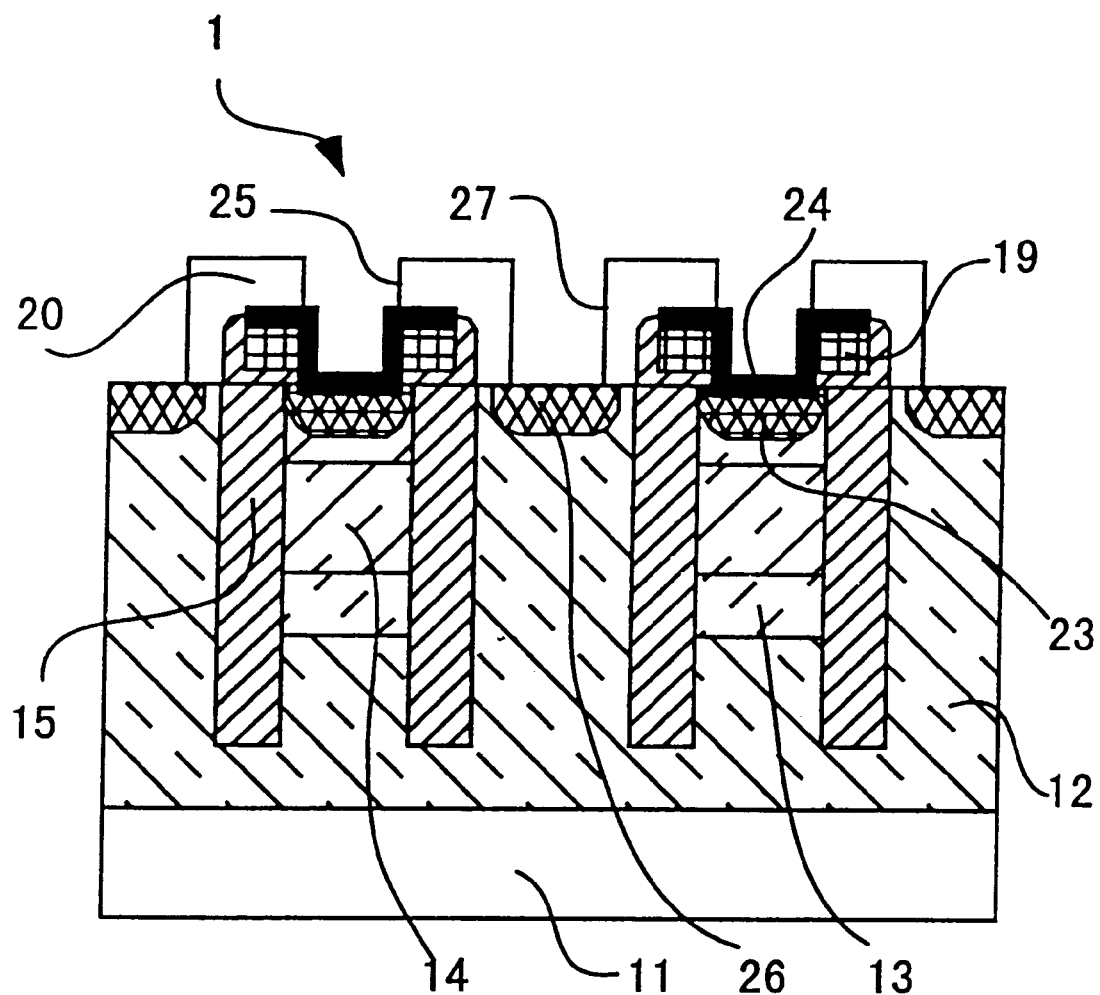
FIG. 3 is a cross-sectional view taken on line B-B' of FIG. 1.
Figure 4:
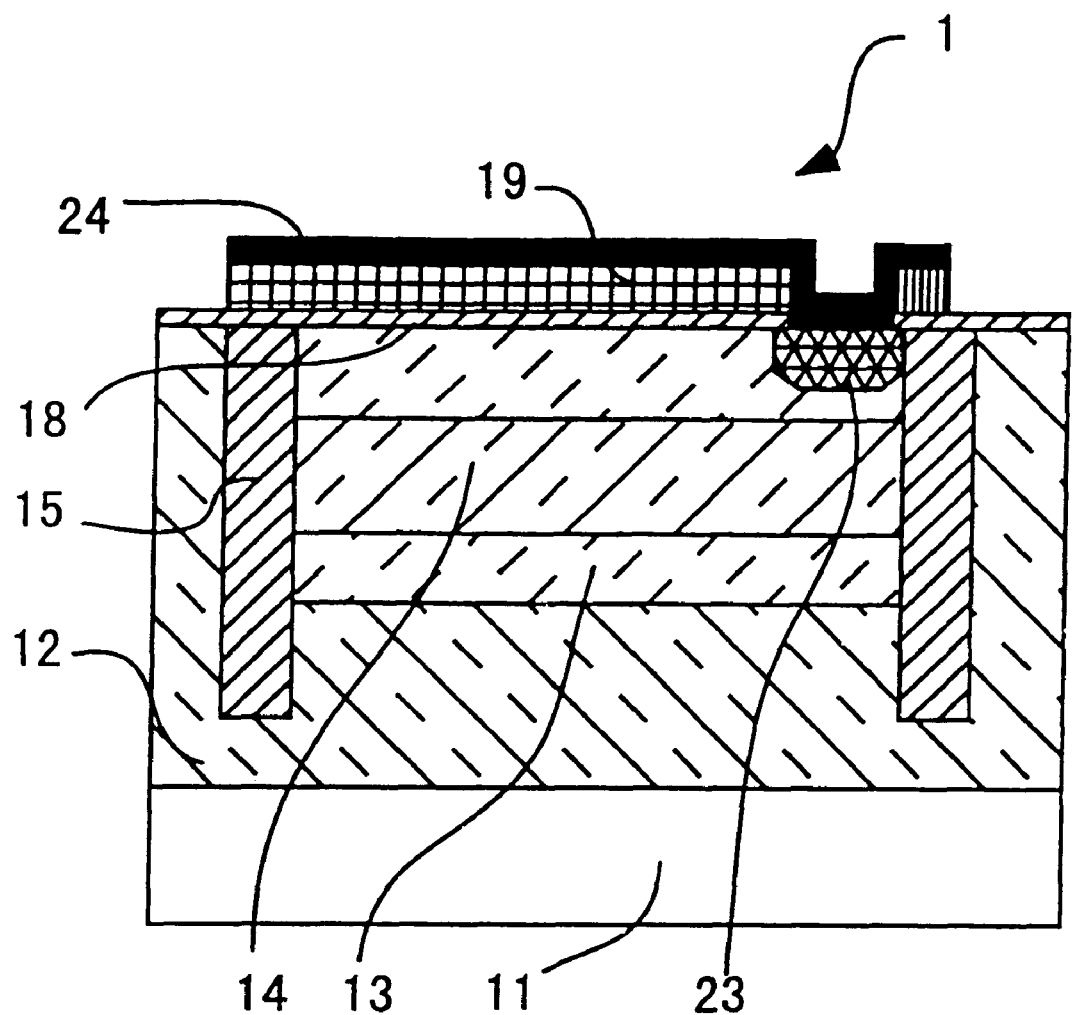
FIG. 4 is a cross-sectional view taken on line C-C' of FIG. 1.
Figure 5:
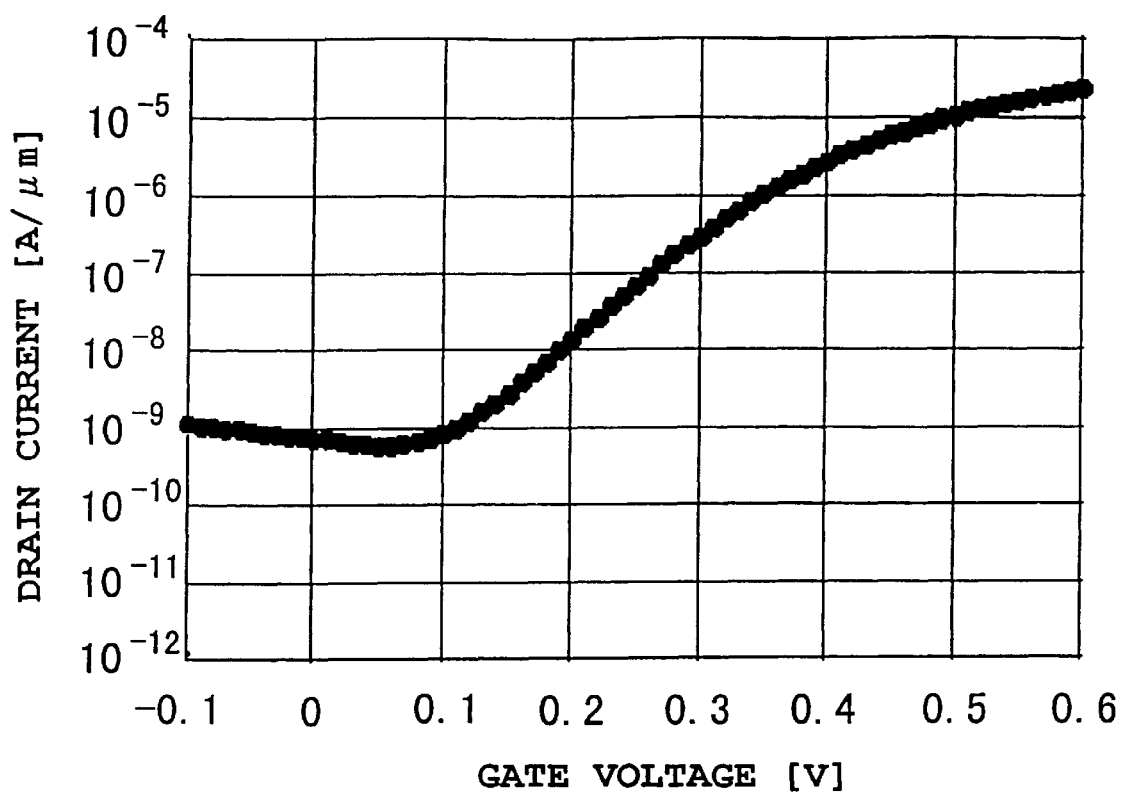
FIG. 5 is a graphical representation showing an operating characteristic of an N-type semiconductor device as shown in FIG. 1 in the case where the dose of $^{11}$B$^+$ ions for forming a shallow well region is $1\times10^{14}$ cm$^{-2}$.
Figure 6:
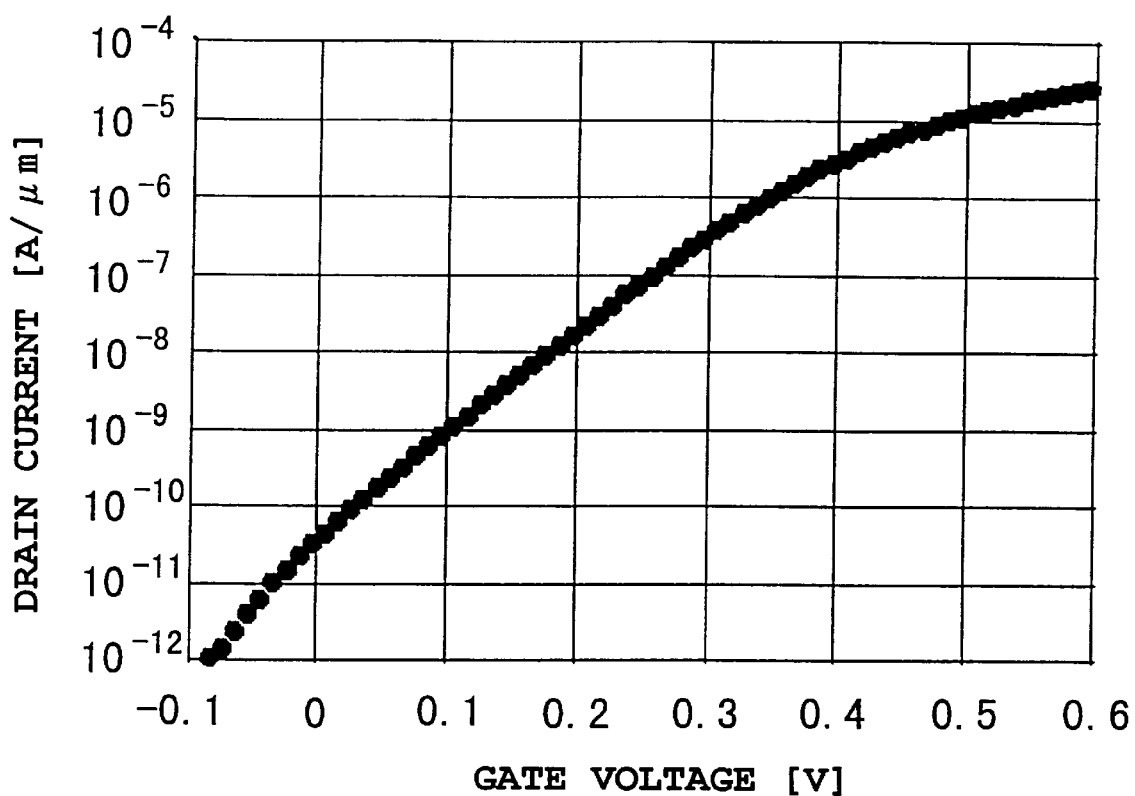
FIG. 6 is a graphical representation showing an operating characteristic of an N-type semiconductor device as shown in FIG. 1 in the case where the dose of $^{11}$B$^+$ ions for forming a shallow well region is $5\times10^{13}$ cm$^{-2}$.
Figure 7:
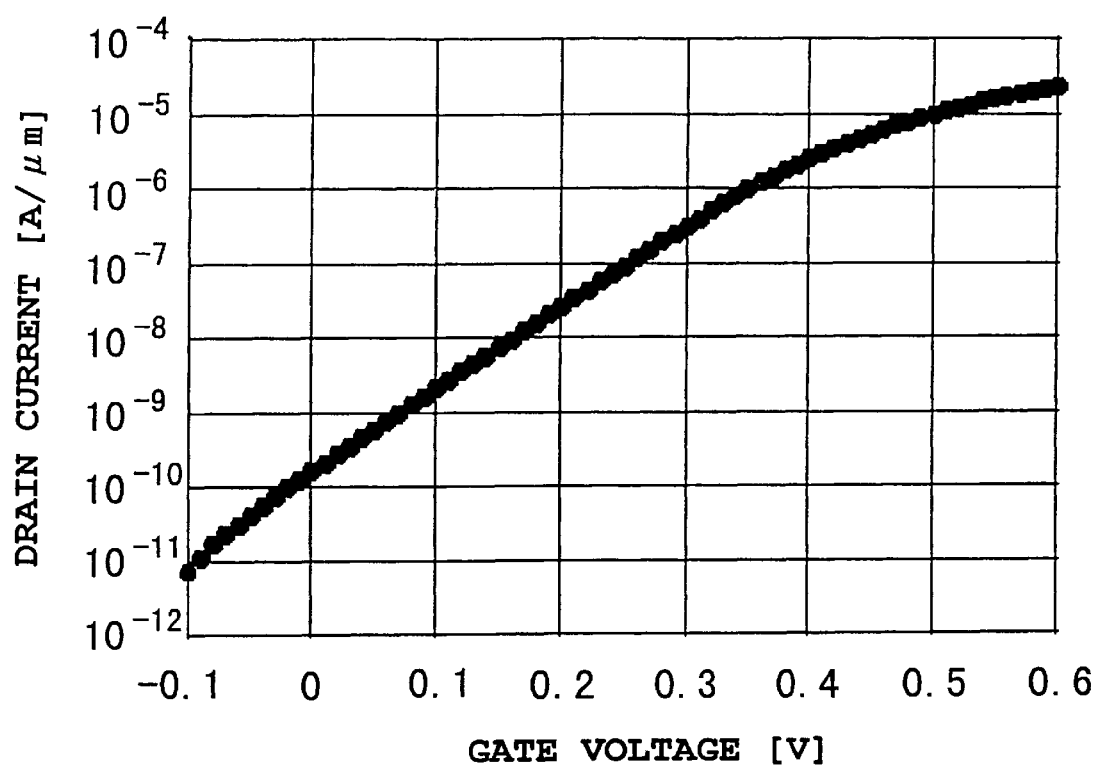
FIG. 7 is a graphical representation showing an operating characteristic of an N-type semiconductor device as shown in FIG. 1 in the case where the dose of $^{11}B^+$ ions for forming a shallow well region is $1 \times 10^{13}$ cm$^{-2}$.
Figure 8:
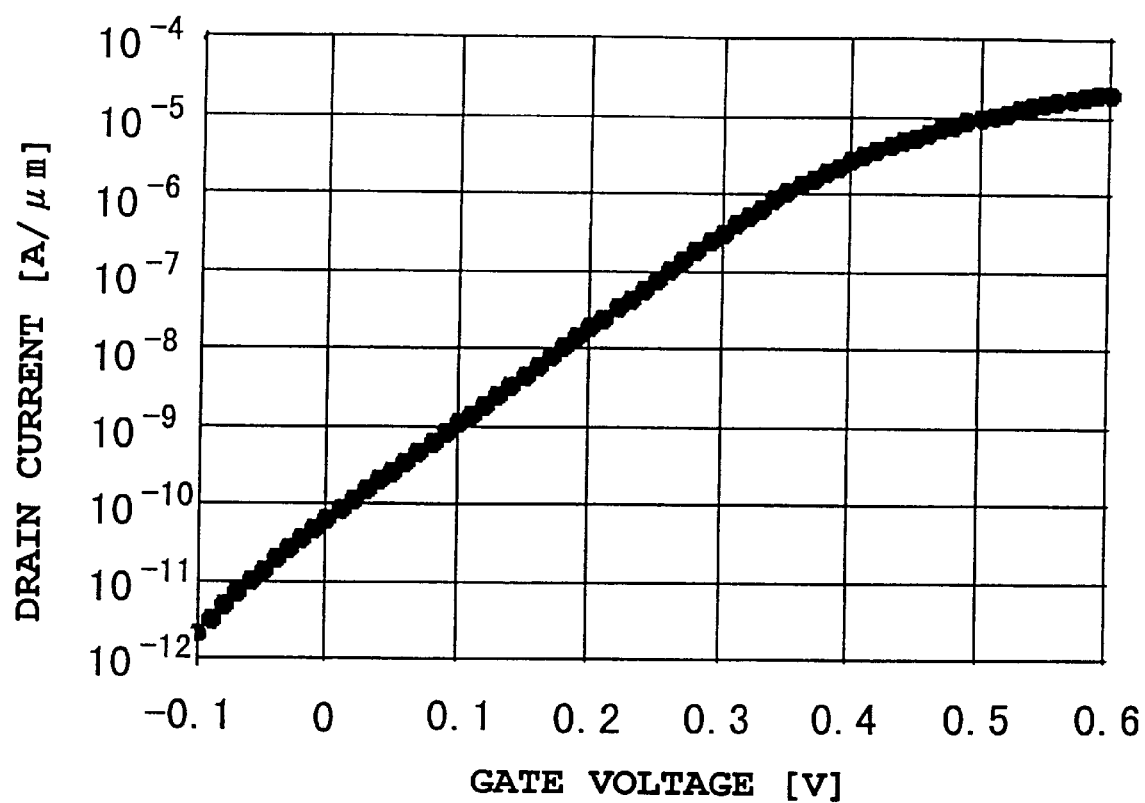
FIG. 8 is a graphical representation showing an operating characteristic of an N-type semiconductor device as shown in FIG. 1 in the case where the dose of $^{11}B^+$ ions for forming a shallow well region is $5 \times 10^{12}$ cm$^{-2}$.
Figure 9:
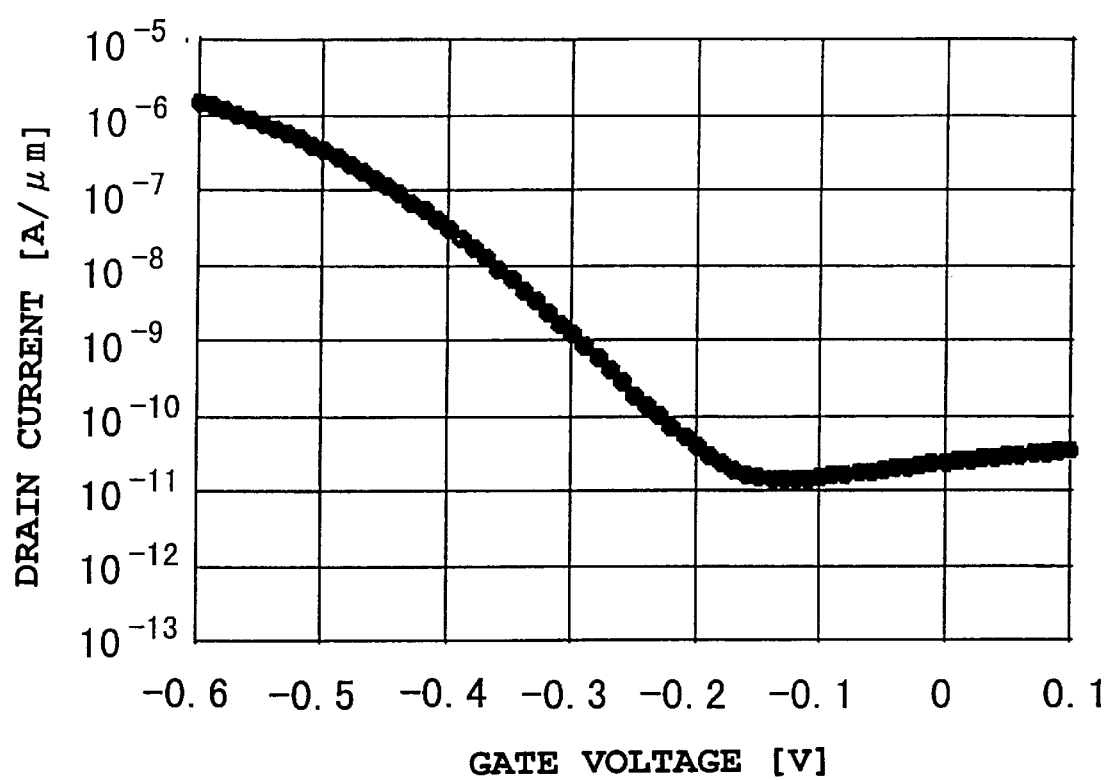
FIG. 9 is a graphical representation showing an operating characteristic of a P-type semiconductor device as shown in FIG. 1 in the case where the dose of $^{31}P^+$ ions for forming a shallow well region is $1 \times 10^{14}$ cm$^{-2}$.
Figure 10:
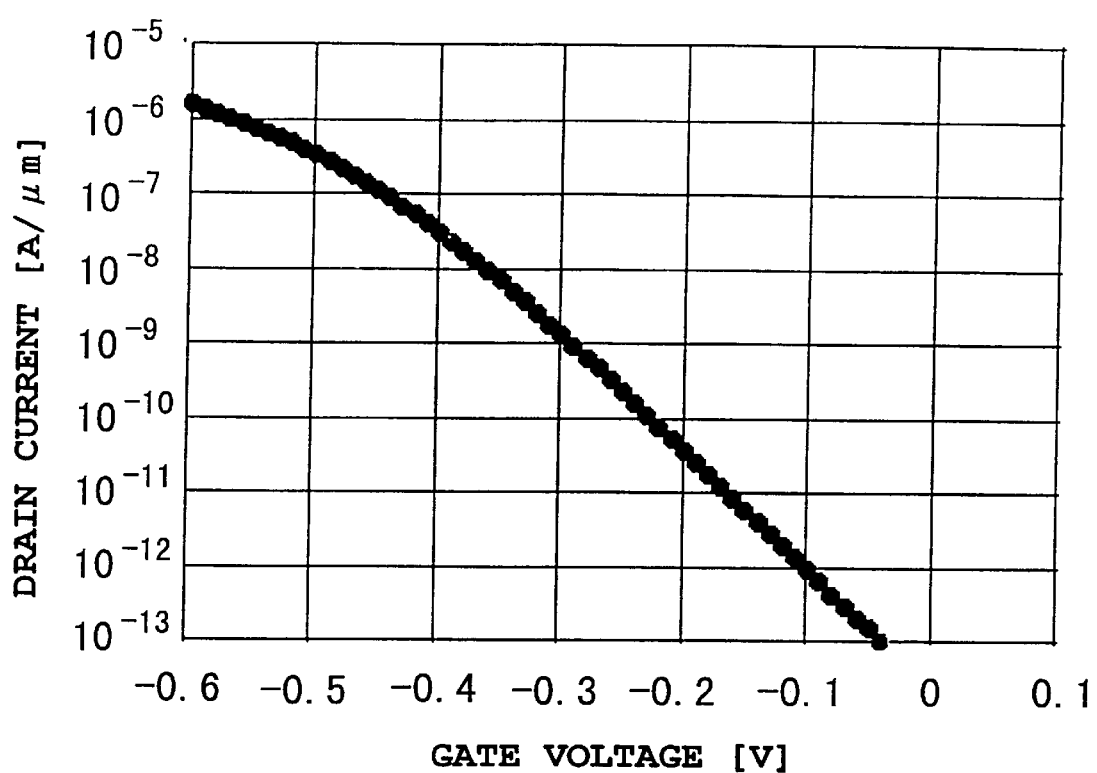
FIG. 10 is a graphical representation showing an operating characteristic of a P-type semiconductor device as shown in FIG. 1 in the case where the dose of $^{31}P^+$ ions for forming a shallow well region is $5 \times 10^{13}$ cm$^{-2}$.
Figure 11:
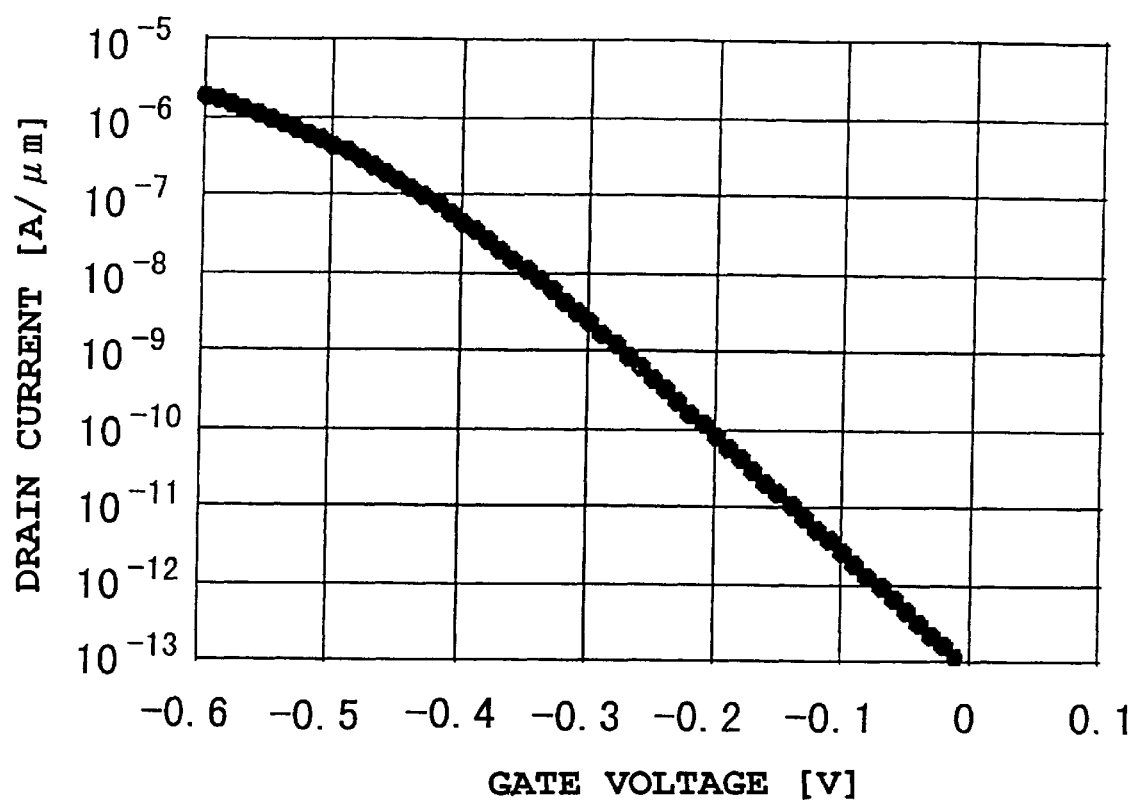
FIG. 11 is a graphical representation showing an operating characteristic of a P-type semiconductor device as shown in FIG. 1 in the case where the dose of $^{31}P^+$ ions for forming a shallow well region is $1 \times 10^{13}$ cm$^{-2}$.
Figure 12:
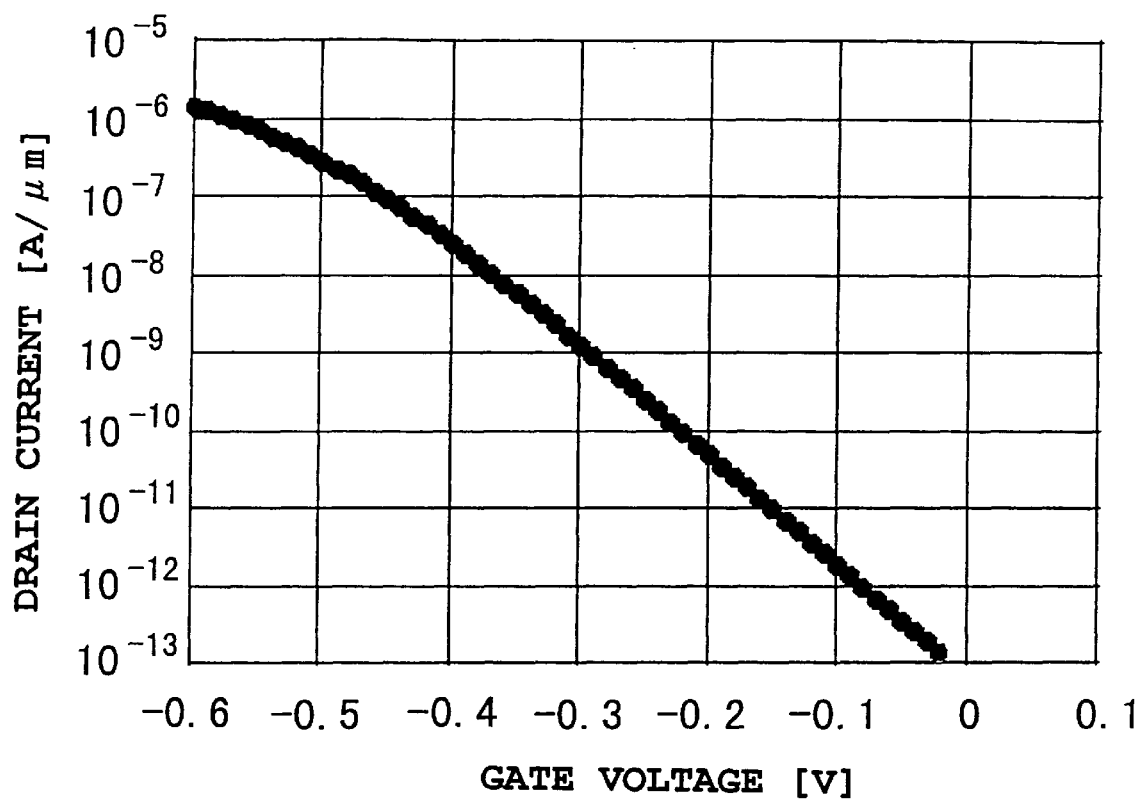
FIG. 12 is a graphical representation showing an operating characteristic of a P-type semiconductor device as shown in FIG. 1 in the case where the dose of $^{31}P^+$ ions for forming a shallow well region is $5 \times 10^{12}$ cm$^{-2}$.

FIGS. 1 to 4 are schematic views illustrating a semiconductor device produced by a production process in accordance with Embodiment 1 of the present invention. FIG. 1 is a plan view, and FIG. 2, FIG. 3 and FIG. 4 are cross-sectional views taken on lines A–A', B–B' and C–C' of FIG.

1, respectively. A silicide region, an interlayer dielectric film and an upper metal wiring are not shown in FIG. 1, the upper metal wiring is not shown in FIGS. 2 and 3, and the interlayer dielectric film and the upper metal wiring are not shown in FIG. 4. FIGS. 1 to 4 show a device having a shallow well region of only one conductivity type, but this is not a limitative embodiment. A device of another conductivity type may also be produced with a similar construction, and furthermore, devices of different conductivity types may be combined.

The semiconductor device 1 of FIGS. 1 to 4 has a deep well region 12 of a first conductivity type formed in a semiconductor substrate 11 and a shallow well region 13 of a conductivity type (a second conductivity type) other than that of the deep well region 12 formed on the deep well region 12. In the shallow well region 13, a buried high-concentration region 14 is formed for reducing the resistance of the shallow well region 13. The shallow well regions 13 of adjacent devices are separated from each other by an insulative trench isolation region 15. In the shallow well region 13, formed are a source region 16 and a drain region 17 of a conductivity type (the first conductivity type) other than that of the shallow well region 13. A gate electrode 19 is formed on a channel region located between the source region 16 and the drain region 17 with intervention of a gate insulating film 18.

The source region 16 and the drain region 17 are electrically connected to the upper metal wiring via contact holes 21 and 22, respectively, which are formed in the interlayer dielectric film 20. In a region which is on the shallow well region 13 and is other than the source region 16 and the drain region 17, a region 23 having a high impurity concentration is formed. The high-concentration region (the second conductivity type) 23 is electrically connected to the gate electrode 19. This high-concentration region 23 is used for ohmic contact between the gate electrode 19 and the shallow well region 13. The gate electrode 19 has a silicide region 24 thereon and is electrically connected to the upper metal wiring via a contact hole 25. On a portion of the deep well region 12 where the shallow well region 13 does not exist, a region 26 having a high impurity concentration (the first conductivity type) is formed. Here, the deep well region 12 is connected to the upper metal wiring via a contact hole 27.

Process for Producing a Semiconductor Device

Now described is a process for producing a CMOS circuit including a semiconductor device 1 shown in FIGS. 1 to 4. It is noted that only the N-type device is shown in FIGS. 1 to 4 and that a P-type device is not shown.

Deep Well Region

In a semiconductor substrate 11, N-type impurity ions were implanted into a region which an N-type device was to be formed (impurity ion species: $^{31}P^+$, implantation energy: 700 KeV, dose: $5\times10^{12}$ cm$^{-2}$), and P-type impurity ions were implanted into a region where a P-type device was to be formed (impurity ion species: $^{11}B^+$, implantation energy: 80 KeV, dose: $7\times10^{12}$ cm$^{-2}$). Subsequently, the resulting substrate 11 was annealed at 1,100° C. for two hours to form a deep P-type well region and a deep N-type well region 12.

Punch-Through Stopper Implantation

Next, punch-through stopper implantation was carried out into the deep N-type well region (impurity ion species: $^{11}B^+$, implantation energy: 15 KeV, dose: $5\times10^{12}$ cm$^{-2}$). On the other hand, the punch-through stopper implantation was also carried out into the deep P-type well region (impurity ion species: $^{31}P^+$, implantation energy: 80 KeV, dose: $3\times10^{12}$ cm$^{-2}$). The ion species used in this punch-through stopper implantation was the same as those used in the later-described ion implantation for the shallow well regions 13, but the implantation energy was lower. The punch-through stopper implantation was for preventing the impurity concentration from becoming too low in a region less deep than 0.2 μm from the surface.

Trench Isolation Region

Thereafter, a trench isolation region 15 (about 1.8 μm deep) was formed.

Shallow Well Region

Next, P-type impurity ions were implanted on the deep N-type well region (impurity ion species: $^{11}B^+$, implantation energy: 250 KeV, dose: $1\times10^{12}$ to $1\times10^{14}$ cm$^{-2}$) to form a shallow P-type well region 13. On the other hand, N-type impurity ions were implanted on the deep P-type well region (impurity ion species: $^{31}P^+$, implantation energy: 450 KeV, dose: $1\times10^{12}$ to $1\times10^{14}$ cm$^{-2}$) to form a shallow N-type well region 13. This ion implantation for forming the shallow well regions 13 was so conducted that the concentration of the implanted impurity was highest at a depth of about 0.6 μm and decreased from that depth as it became deeper and shallower. This portion having the highest impurity concentration was the aforesaid buried high-concentration region 14 for reducing the resistance of the shallow well region 13. Further ion implantation was carried out as required for threshold adjustment.

Gate Electrode and Gate Insulating Film

Thereafter, gate oxidation was carried out to form a gate insulating film 18 (3 nm thick) and then a gate electrode 19 was formed from polysilicon.

Subsequently, ion implantation was carried out for forming an LDD region (N channel impurity ion species: $^{75}As^+$, implantation energy 20 KeV, dose: $3\times10^{14}$ cm$^{-2}$; P channel: impurity ion species: $^{49}BF^{2+}$, implantation energy: 20 KeV, dose: $4\times10^{13}$ cm$^{-2}$).

Thereafter, a sidewall spacer was formed on a sidewall of the gate electrode 19. Then, in order to provide a region of an electrical connection for the gate electrode 19 with the shallow well region 13 in a region other than the source region 16, the drain region 17 and the channel region, the gate electrode and the gate oxide film in that region were etched to expose the underlying substrate. In this exposed region, high-concentration regions 23 was formed.

Source Region and Drain Region

Subsequently, in order to form an N-type source region and an N-type drain region, impurity ions were implanted (impurity ion species: $^{75}As^+$, implantation energy: 40 KeV, dose: $3\times10^{15}$ cm$^{-2}$) and annealed at 850° C. for 30 minutes for activation. On the other hand, in order to form a P-type source region and a P-type drain region, impurity ions were implanted (impurity ion species: $^{11}B^+$, implantation energy: 15 KeV, dose: $3\times10^{15}$ cm$^{-2}$) and subjected to an RTA treatment (1,000° C., 10 seconds). By these implantations, the high-concentration regions 23 and 26 were able to be formed simultaneously with the formation of the source region 16 and the drain region 17.

Thereafter, the upper layers of the source region 16, the drain region 17, the gate electrode 19 and the high-concentration regions 23 and 26 were made into silicide. This silicide formation provided an ohmic contact between the gate electrode 19 and the shallow well region 13. Then an interlayer dielectric film was formed, and contact holes 21, 22, 25 and 27 were formed in the interlayer dielectric film. Then the source region 16, the drain region 17, the gate electrode 19 and the deep well region 12 were connected to the upper metal wiring by metallization.

By the above-described process, a CMOS circuit was produced.

In this process, the shallow well region was thermally treated simultaneously with the formation of the gate insulating film and with the thermal treatment of the source region and the drain region.

Effect of Embodiment 1

FIGS. 5 to 8 are graphical representations showing relationships of a drain current to a gate voltage regarding a unit gate width of N-type MOSFETs whose gate length was 0.26 µm and which were produced by the above-described process. FIG. 5, FIG. 6, FIG. 7 and FIG. 8 show characteristics in the cases where the $^{11}B^+$ dose implanted in P-type shallow well regions were $1\times10^{14}$ cm$^{-2}$, $5\times10^{13}$ cm$^{-2}$, $1\times10^{13}$ cm$^{-2}$ and $5\times10^{12}$ cm$^{-2}$, respectively. In each case, the implantation energy was 250 KeV.

FIGS. 9 to 12 are graphical representations showing relationships of the drain current to the gate voltage regarding the unit gate width of P-type MOSFETs whose gate length was 0.50 µm and which were produced by the above-described process. FIG. 9, FIG. 10, FIG. 11 and FIG. 12 show characteristics in the cases where the $^{31}P^+$ dose implanted in the N-type shallow well regions were $1\times10^{14}$ cm$^{-2}$, $5\times10^{13}$ cm$^{-2}$, $1\times10^{13}$ cm$^{-2}$ and $5\times10^{12}$ cm$^{-2}$, respectively. In each case, the implantation energy was 450 KeV.

In the case of the N-type MOSFETs, when the dose of $^{11}B^+$ ions in the shallow well region 13 is $1\times10^{14}$ cm$^{-2}$, the ratio of the drain current at a 0.5V bias to that at a 0V bias on the gate electrode 19 fall short of $10^5$. This is not a sufficient on-off current ratio for a power-saving device. On the other hand, when the dose of $^{11}B^+$ ions in the shallow well region 13 is $5\times10^{13}$ cm$^{-2}$ or less, the drain current ratio is about $10^5$ or more, and therefore it is understood that a sufficient on-off current ratio can be obtained.

In the case of the P-type MOSFET, when the dose of $^{31}P^+$ ions in the shallow well region 13 is $1\times10^{14}$ cm$^{-2}$, the ratio of the drain current at a −0.5V bias to that at a 0V bias on the gate electrode 19 fall short of $10^5$. This is not a sufficient on-off current ratio for a power-saving device. On the other hand, when the dose of $^{31}P^+$ ions in the shallow well region is $5\times10^{13}$ cm$^{-2}$ or less, the drain current ratio is about $10^6$ or more, and therefore it is understood that a sufficient on-off current ratio can be obtained.

Figure 13:
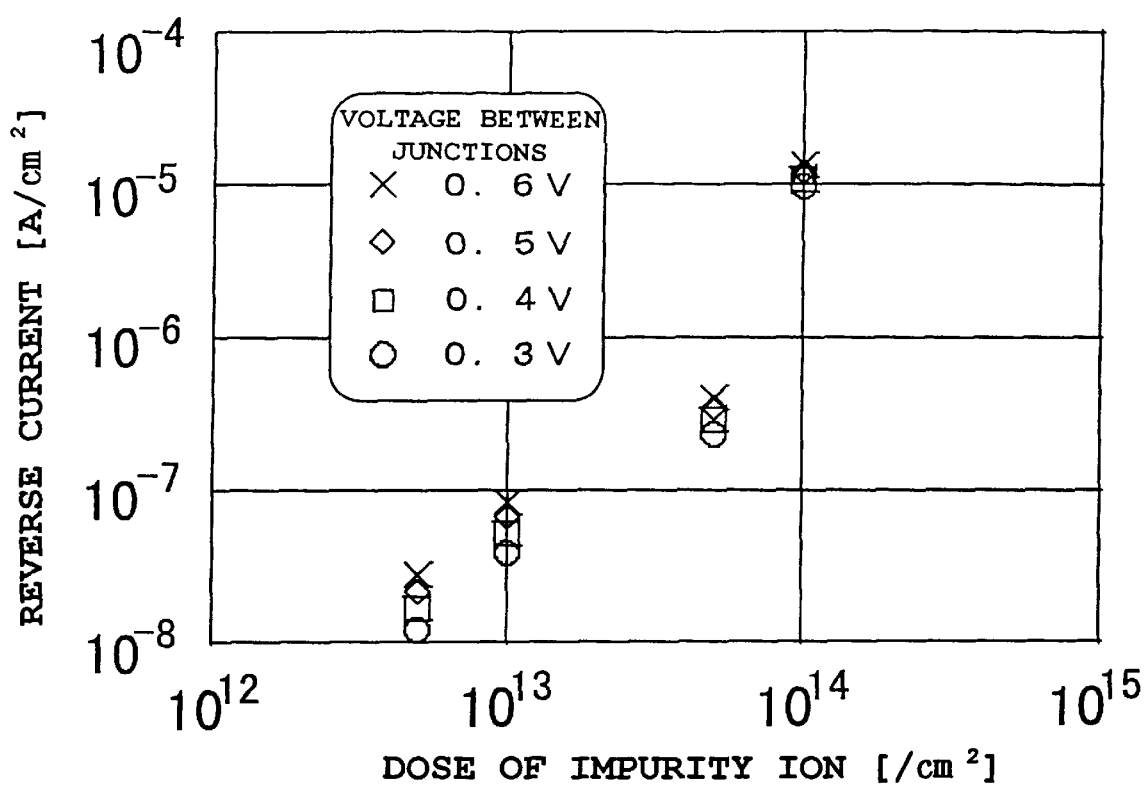
FIG. 13 is a graphical representation showing a relationship of a reverse current at junctions of a shallow well region with a source region and a drain region with respect to the dose of ions for forming the shallow well region in an N-type semiconductor device as shown in FIG. 1.
Figure 14:
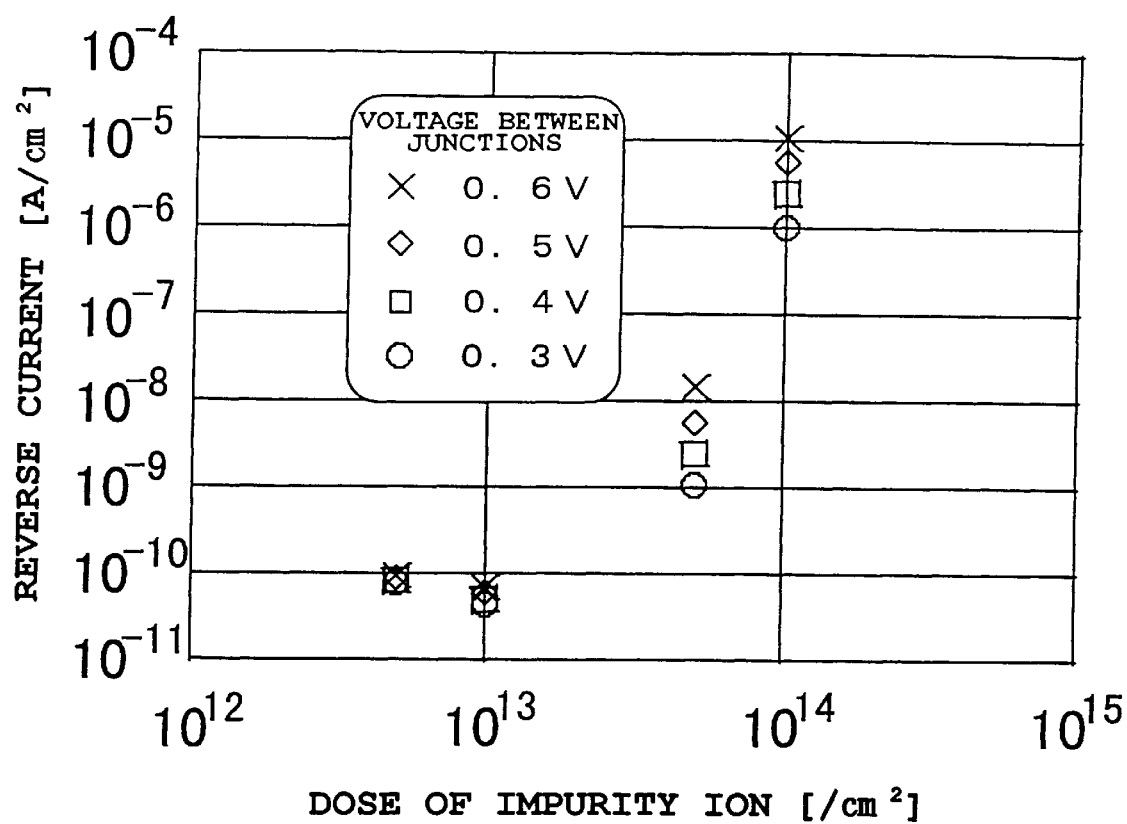
FIG. 14 is a graphical representation showing a relationship of a reverse current at junctions of a shallow well region with a source region and a drain region with respect to the dose of ions for forming the shallow well region in a P-type semiconductor device as shown in FIG. 1.

FIGS. 13 and 14 are graphs in which plotted is a reverse current per unit area at the junction of the source region 16 or the drain regions 17 with the shallow well region 13, which regions were produced by the aforesaid process. FIG. 13 shows a reverse current at the junction of the N-type source or drain region with the shallow P-type well region, and FIG. 14 shows a reverse current at the junction of the P-type source or drain region with the shallow N-type well region. In either type, the reverse current increases relatively moderately as the dose into the shallow well region approaches up to $5\times10^{13}$ cm$^{-2}$. But where the dose reaches $1\times10^{14}$ cm$^{-2}$, the reverse current increase greatly.

Figure 15:
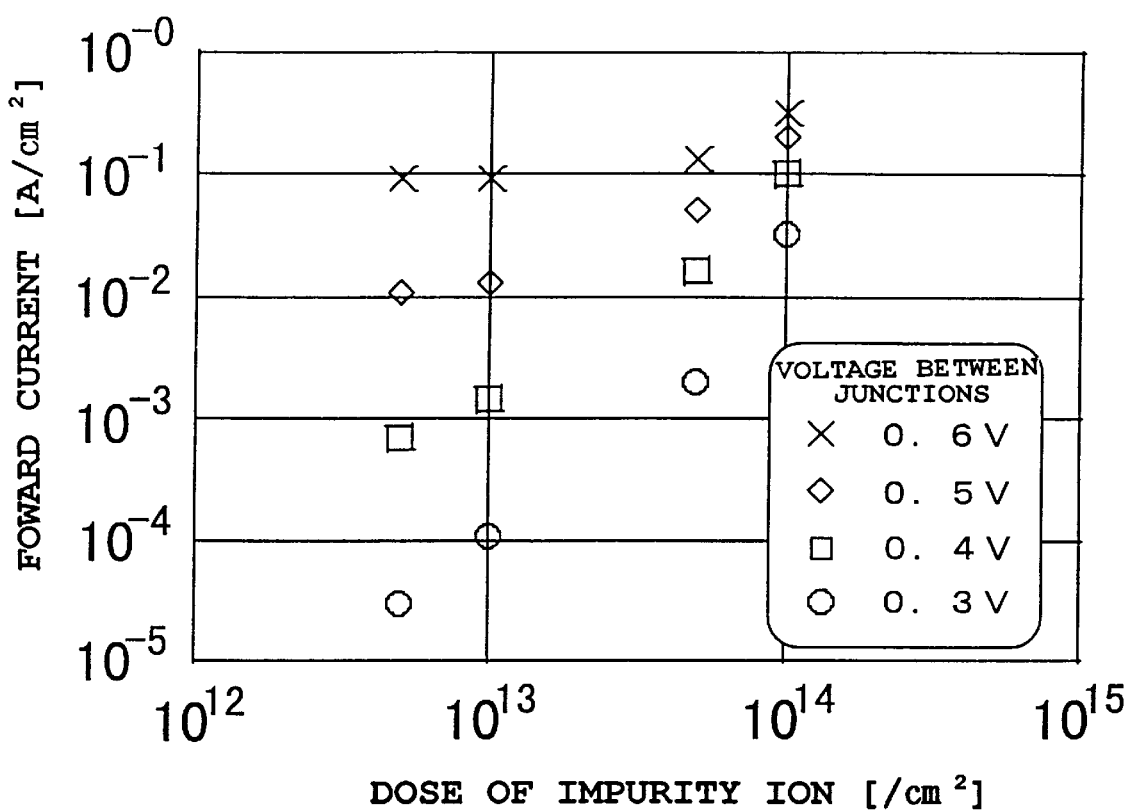
FIG. 15 is a graphical representation showing a relationship of a forward current at junctions of a shallow well region with a source region and a drain region with respect to the dose of ions for forming the shallow well region in an N-type semiconductor device as shown in FIG. 1.
Figure 16:
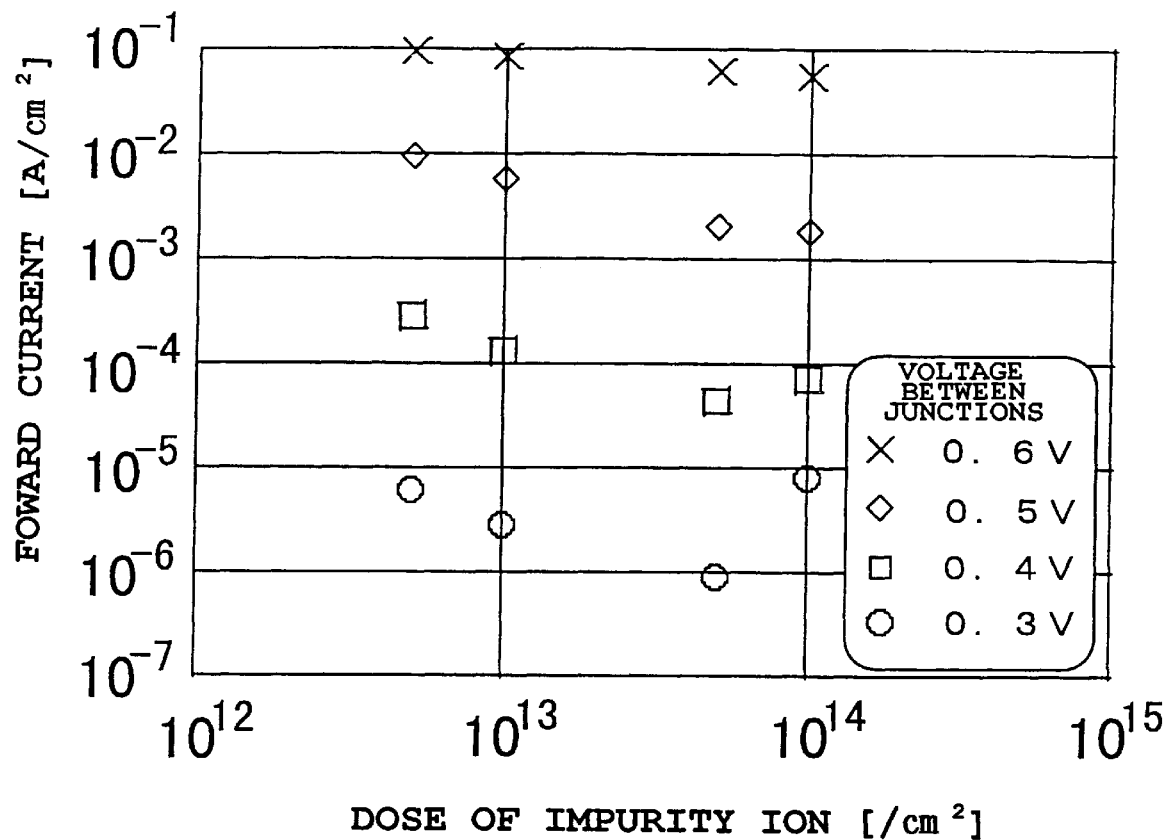
FIG. 16 is a graphical representation showing a relationship of a forward current at junctions of a shallow well region with a source region and a drain region with respect to the dose of ions for forming the shallow well region in a P-type semiconductor device as shown in FIG. 1.

FIGS. 15 and 16 are graphs in which plotted is a forward current per unit area at the junction of the source region 16 or the drain regions 17 with the shallow well region 13, which regions were produced by the aforesaid process. FIG. 15 shows a forward current at the junction of the N-type source or drain region with the shallow P-type well region, and FIG. 16 shows a forward leakage current at the junction of the P-type source or drain region with the shallow N-type well region. Usually the forward current decreases if the dose into the shallow well region is increased and the impurity concentration rises. However, as shown in FIG. 15, the forward current increases at the junction of the N-type source or drain region with the shallow P-type well region as the dose into the shallow well region is increased, and where the dose reaches $1\times10^{14}$ cm$^{-2}$, the forward current increases greatly. Further, as shown in FIG. 16, the forward current decreases at the junction of the P-type source or drain region with the shallow N-type well region as the dose into the shallow well region is increased. Where the dose reaches $1\times10^{14}$ cm$^{-2}$, the forward current turns increase at a voltage of 0.4V or less between junctions.

The reason why the forward and reverse currents increase at the junction of the source or drain region 16 or the drain region 17 with the shallow well region 13 with the increase of the dose into the shallow well region, as described above, is that the implantation of the impurity gives rise to defects in the crystal lattice of silicon, which results in defects in a specific energy level. Especially, it is considered that the leakage current increases greatly when the dose into the shallow well region is $1\times10^{14}$ cm$^{-2}$, because a large number of defects are generated in a specific energy level. This increase of the junction leakage current causes the increase of the off-leak in MOSFET.

As described above, in the case of N-type (P-type) MOSFETs, the off-leak have a great effect on the characteristics of the device when the dose of $^{11}B^+$ ($^{31}P^+$) into the shallow well region is $1\times10^{14}$ cm$^{-2}$ or more. When the dose is less than that, the effect may be neglected. Therefore, in the case the N-type (P-type) MOSFETs, the $^{11}B^+$ ($^{31}P^+$) ion dose into the shallow well region is desirably less than $1\times10^{14}$ cm$^{-2}$.

In this embodiment, major thermal treatments after the ion implantation into the shallow well region are only the gate oxidation (at 900° C.) and the thermal treatment for activation of impurity ions (annealing in a nitrogen atmosphere at 850° C. for 30 minutes and RTA at 1,000° C. for 10 seconds). However, if these thermal treatments are carried out at sufficiently high temperatures, crystal defects which may cause leakage current can be recovered.

Accordingly, in the case where the shallow well region is formed through the ion implantation step and the thermal treatment step at 900° C. to 1,100° C. for activating the implanted impurity ions and both the steps are carried out after the formation of the trench isolation region and before the formation of the trench isolation region and before the formation of the gate insulating film, the shallow well region is desirably doped with $^{11}B^+$ ($^{31}P^+$) at a dose less than $2\times10^{14}$ cm$^{-2}$. In the case where the ion implantation for forming the shallow well region is conducted before the thermal treatment step for the trench isolation region at 1,000 to 1,150° C., the shallow well region is desirably doped with $^{11}B^+$ ($^{31}P^+$) at a dose less than $4\times10^{14}$ cm$^{-2}$.

In the case of N-type MOSFETs, where the implantation energy of $^{11}B^+$ into the shallow well region 13 is less than 60 KeV, the impurity concentration is highest at a depth of about 0.2 µm and has a strong effect on the impurity concentration in the channel. For this reason, if the implantation energy is lower than 60 KeV, it is difficult to achieve both the decrease of the resistance of the shallow well region and the decrease of the threshold voltage for lower voltage operation. On the other hand, where the implantation energy of $^{11}B^+$ into the shallow well region is 500 KeV, the impurity concentration is highest at a depth of about 1 µm.

For this reason, if the implantation energy is higher than 500 KeV, the depth of the trench isolation region 15 needs to be 2 µm or more. Also the impurity concentration becomes very low at proximity of the surface, and therefore, another implantation is required for compensation. Furthermore, as the implantation energy rises, the crystal of the silicon substrate is more damaged, which results in an increase in the off-leak. For the above reasons, in the case of the N-type MOSFETs, the implantation energy of $^{11}B^+$ into the shallow well region is desirably from 60 KeV to 500 KeV.

In the case of P-type MOSFETs, where the implantation energy of $^{31}P^+$ into the shallow well region 13 is 150 KeV, the impurity concentration is highest at a depth of about 0.2 $\mu$m and has a strong effect on the impurity concentration in the channel. For this reason, if the implantation energy is lower than 150 KeV, it is difficult to achieve both the reduction of the resistance of the shallow well region and the reduction of the threshold voltage for lower voltage operation. On the other hand, where the implantation energy of $^{31}P^+$ into the shallow well region is 900 KeV, the impurity concentration is highest at a depth of about 1 $\mu$m.

For this reason, if the implantation energy is higher than 900 KeV, the depth of the trench isolation region 15 needs to be 2 $\mu$m or more. Also the impurity concentration becomes very low at proximity of the surface, and therefore, another implantation is required for compensation. Furthermore, as the implantation energy rises, the crystal of the silicon substrate is more damaged, which results in an increase in the off-leak. For the above reasons, in the case of the P-type MOSFETs, the implantation energy of $^{31}P^+$ into the shallow well region is desirably from 150 KeV to 900 KeV.

According to the above-described production process, damage to the crystal of the silicon substrate can be limited by controlling the dose and energy of $^1B^+$ and $^{31}P^+$ when the shallow well region is formed. Also the impurity concentration near the channel can be controlled to be low by setting the lower limit for the implantation energy so that the depth at which the impurity concentration is highest is sufficiently larger than the depth of the channel.

Therefore, the reverse and forward leakage currents at the PN-junction can be suppressed and thereby the off-leak in the MOSFET can be avoided. Also a low threshold voltage required for low voltage operation can be realized.

Embodiment 2

A second embodiment of the present invention is described with reference to FIGS. 17 to 20 as follows.

Figure 17:
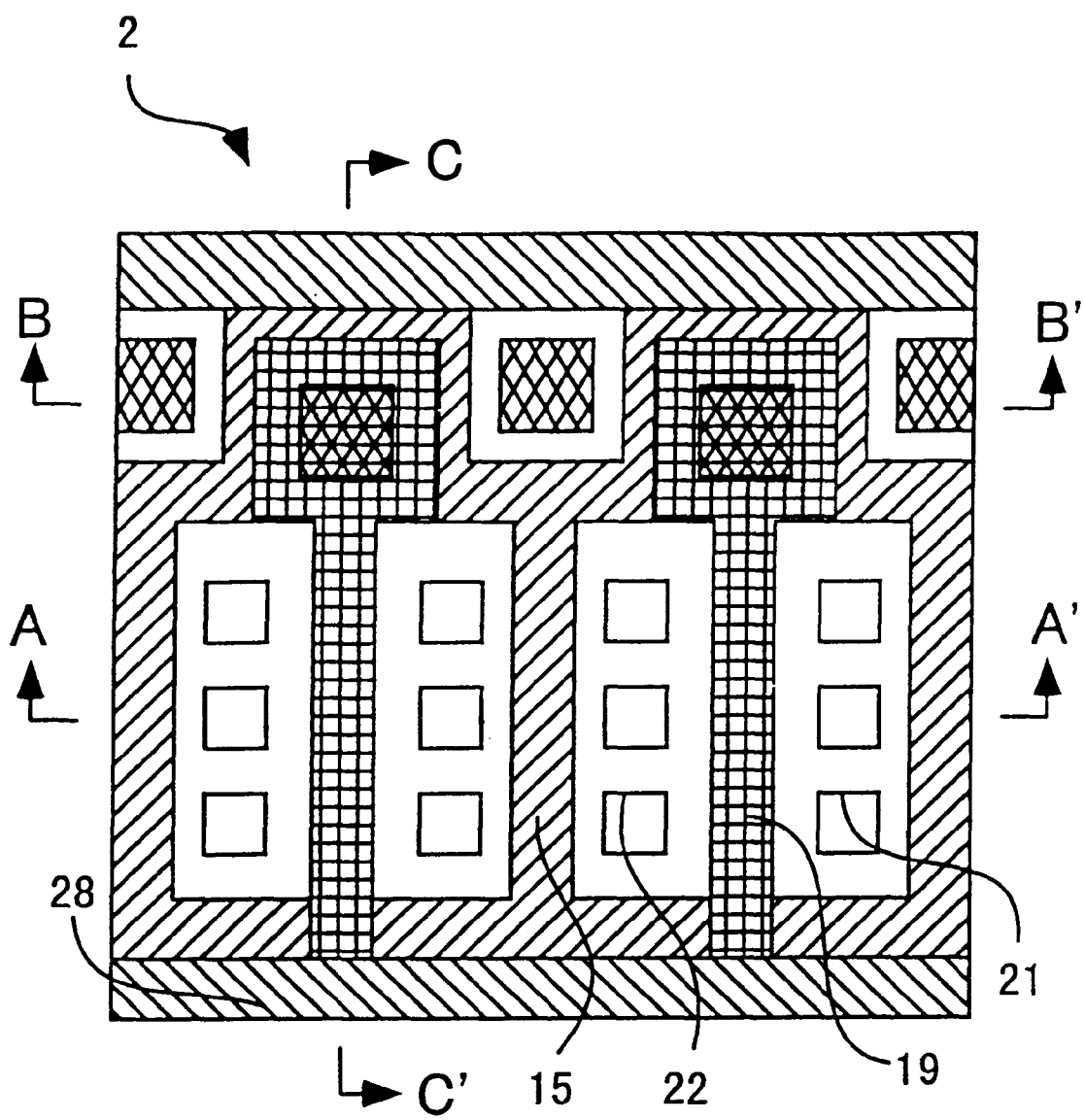
FIG. 17 is a plan view illustrating a semiconductor device produced by a production process in accordance with Embodiment 2 of the present invention.
Figure 18:
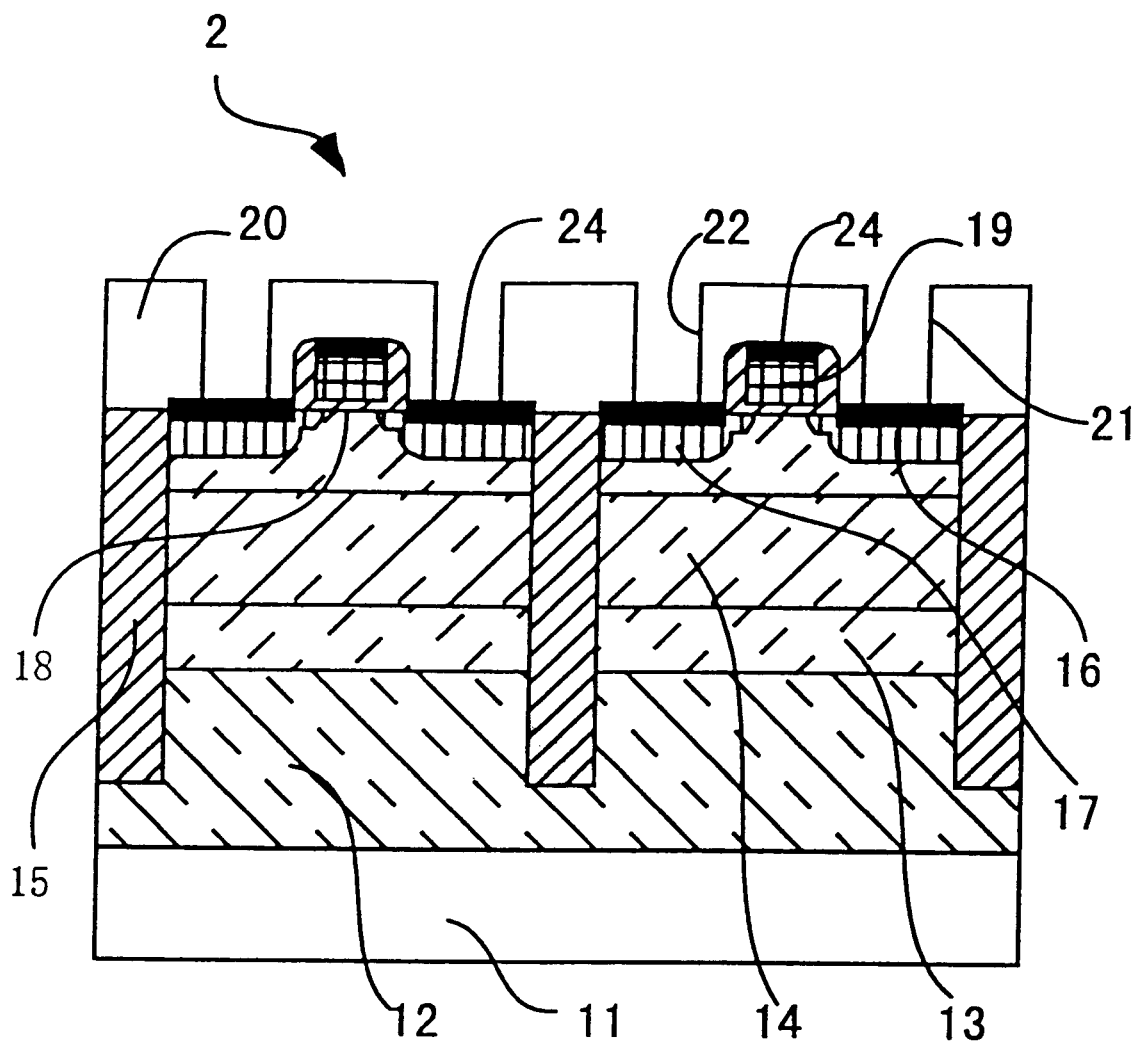
FIG. 18 is a cross-sectional view taken on line A-A' of FIG. 17.
Figure 19:
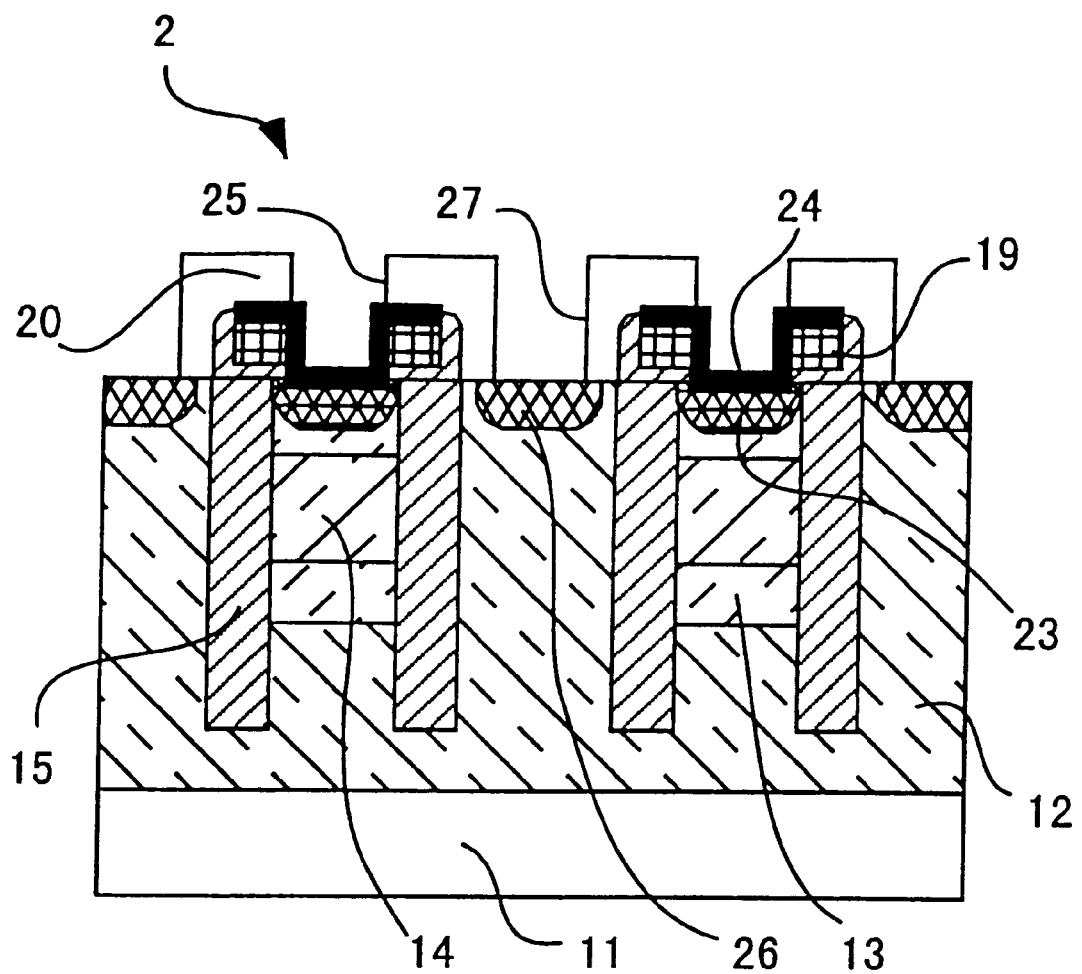
FIG. 19 is a cross-sectional view taken on line B-B' of FIG. 17.
Figure 20:
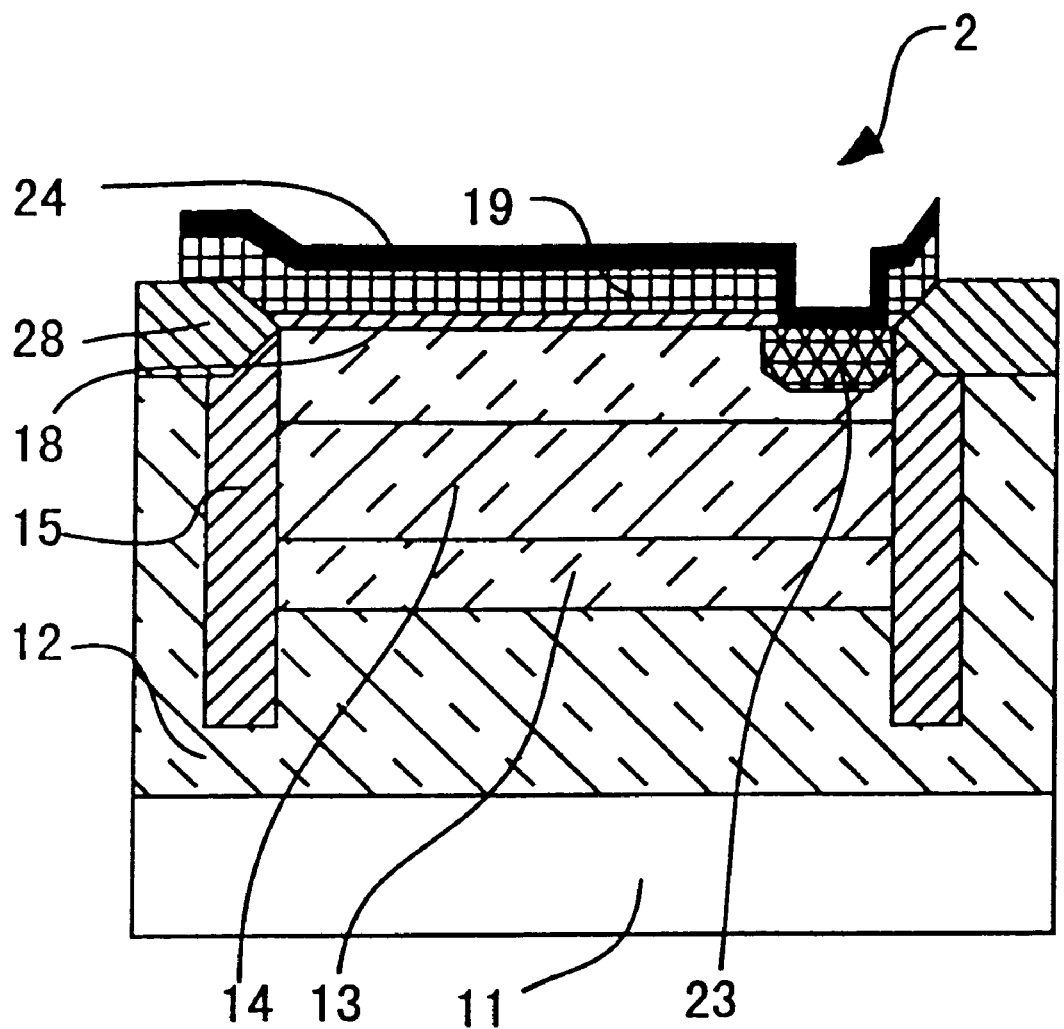
FIG. 20 is a cross-sectional view taken on line C-C' of FIG. 17.

FIGS. 17 to 20 are schematic views illustrating a semiconductor device produced by a production process in accordance with Embodiment 2 of the present invention. FIG. 17 is a plan view, and FIGS. 18, 19 and 20 are cross-sectional views taken on lines A–A', B–B' and C–C' of FIG. 17, respectively. It is noted that a silicide region, an interlayer dielectric film and an upper metal wiring are not shown in FIG. 17, the upper metal wiring is not shown in FIGS. 18 and 19, and the interlayer dielectric film and the upper metal wiring are not shown in FIGS. 18 and 19.

A semiconductor device 2 includes the aforesaid semiconductor device 1 and a field oxide film 28 in addition thereto. This semiconductor device 2 is produced by forming the field oxide film 28 after the trench isolation region 15 is formed during the above-described process for forming the semiconductor device 1. When the trench isolation region 15 is formed, it is difficult to change its width depending upon where on the substrate the trench isolation region is located. Accordingly, where it is necessary to form a wide device isolation region, forming the field oxide film 28 is advantageous. Thereby, by combining as required the trench isolation region which requires a smaller area for device isolation with the field oxide film which has a large width, it will be possible to minimize the area necessary for device isolation. It is noted that the formation of the field oxide film 28 does not affect the damage or the like to the crystal of the silicon substrate by the impurity implantation for forming the shallow well region 13 and that the characteristics of the obtained MOSFET device are not different from those of the above-described semiconductor device 1.

Accordingly, also in this case, the damage to the crystal of the silicon substrate can be limited by controlling the dose and energy of $^{11}B^+$ ions and $^{31}P^+$ ions for forming the shallow well region. Also the impurity concentration near the channel can be controlled to be low by setting the lower limit for the implantation energy so that the depth at which the impurity concentration is highest is sufficiently larger than the depth of channel.

Therefore, the reverse and forward leakage currents at the PN-junction can be suppressed and thereby the off-leak in the MOSFET can be avoided. Also a low threshold voltage required for low voltage operation can be realized.

Figure 26:
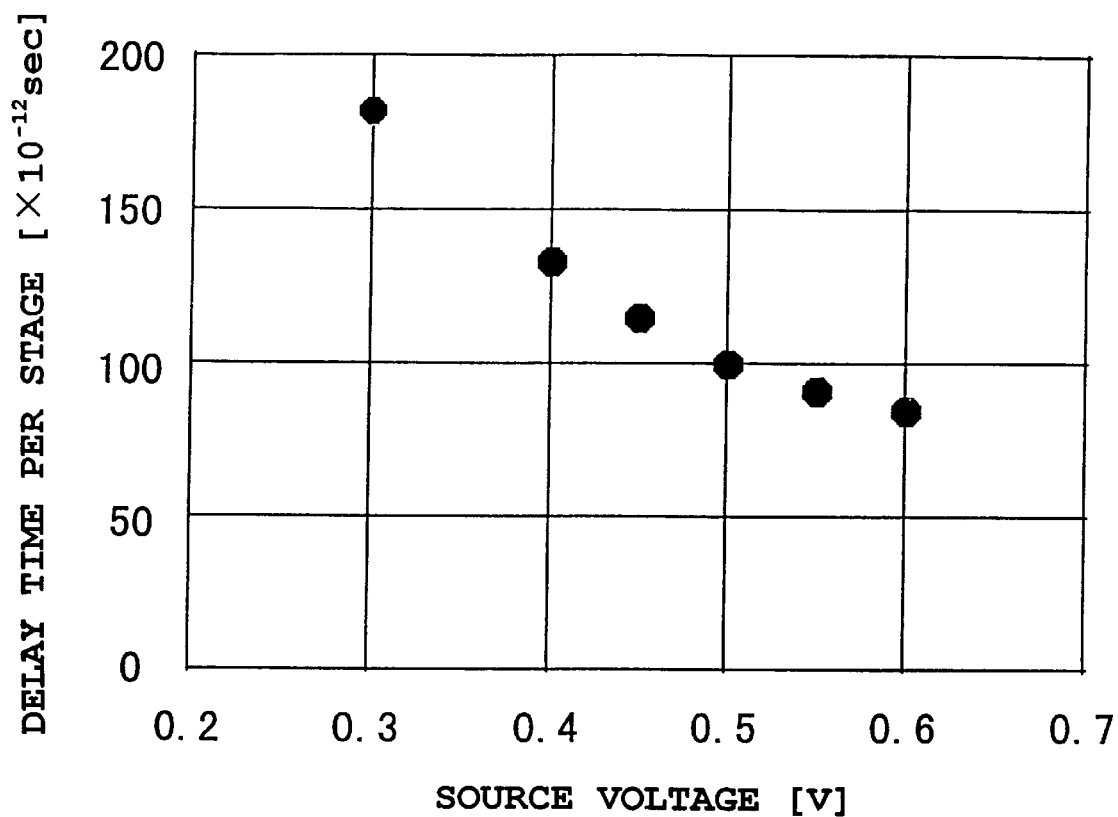
FIG. 26 is a graphical representation showing a relationship of a delay time per stage of a ring oscillator composed of a semiconductor device as shown in FIG. 1.
Figure 27A:
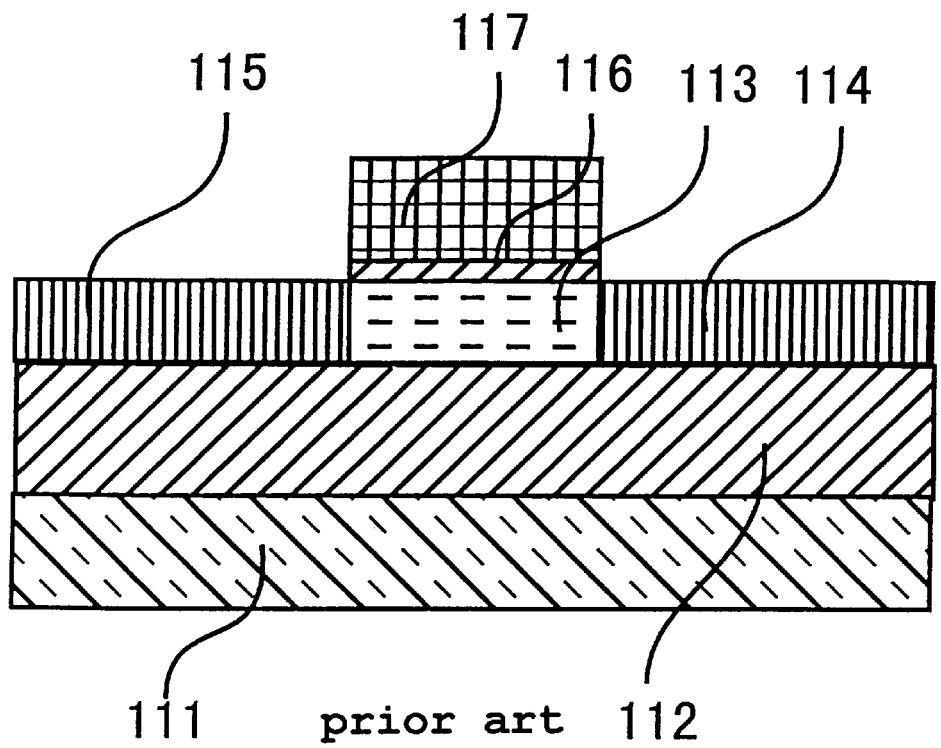
FIG. 27 is a sectional view illustrating a conventional dynamic threshold voltage transistor using a SOI substrate.
Figure 27B:
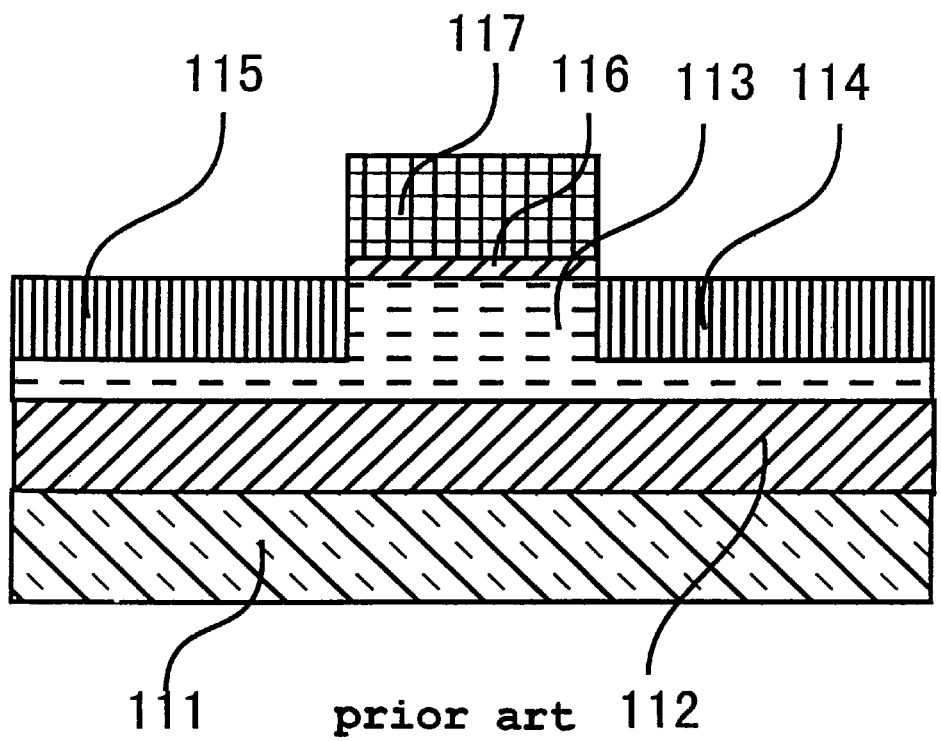
Figure 28:
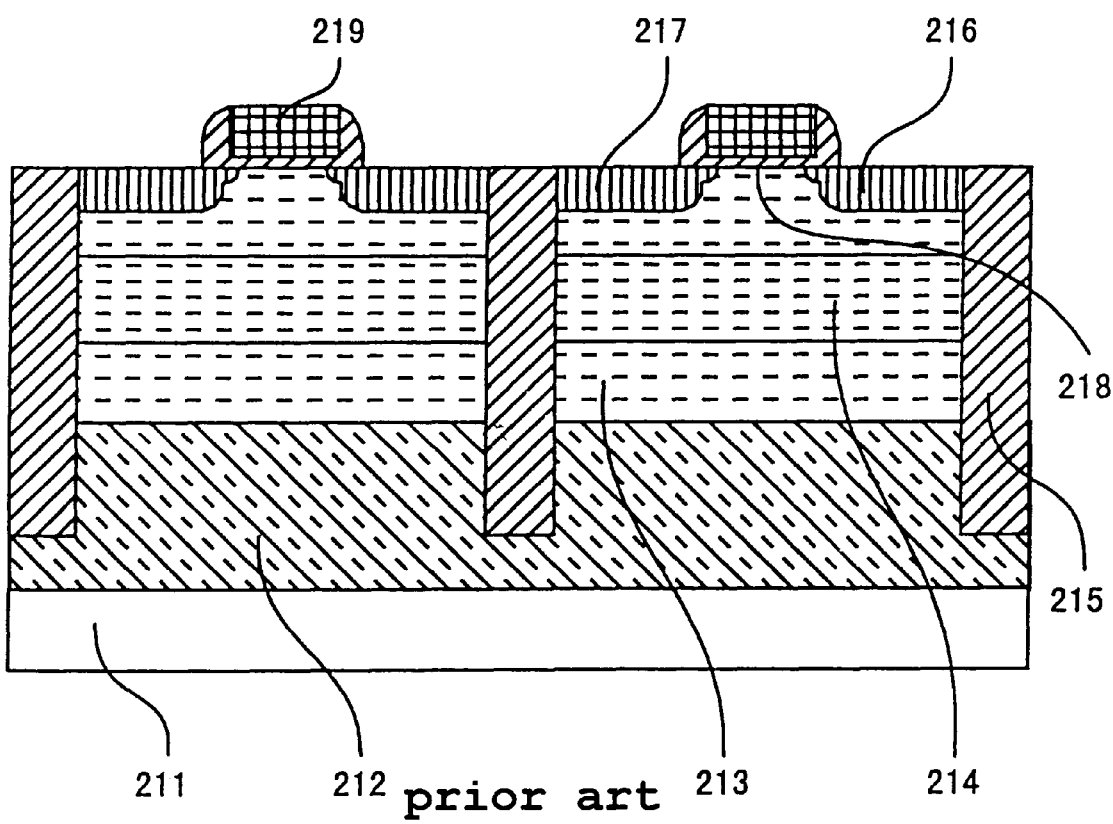
FIG. 28 is a sectional view illustrating a conventional dynamic threshold voltage transistor using a bulk substrate.
Figure 29A:
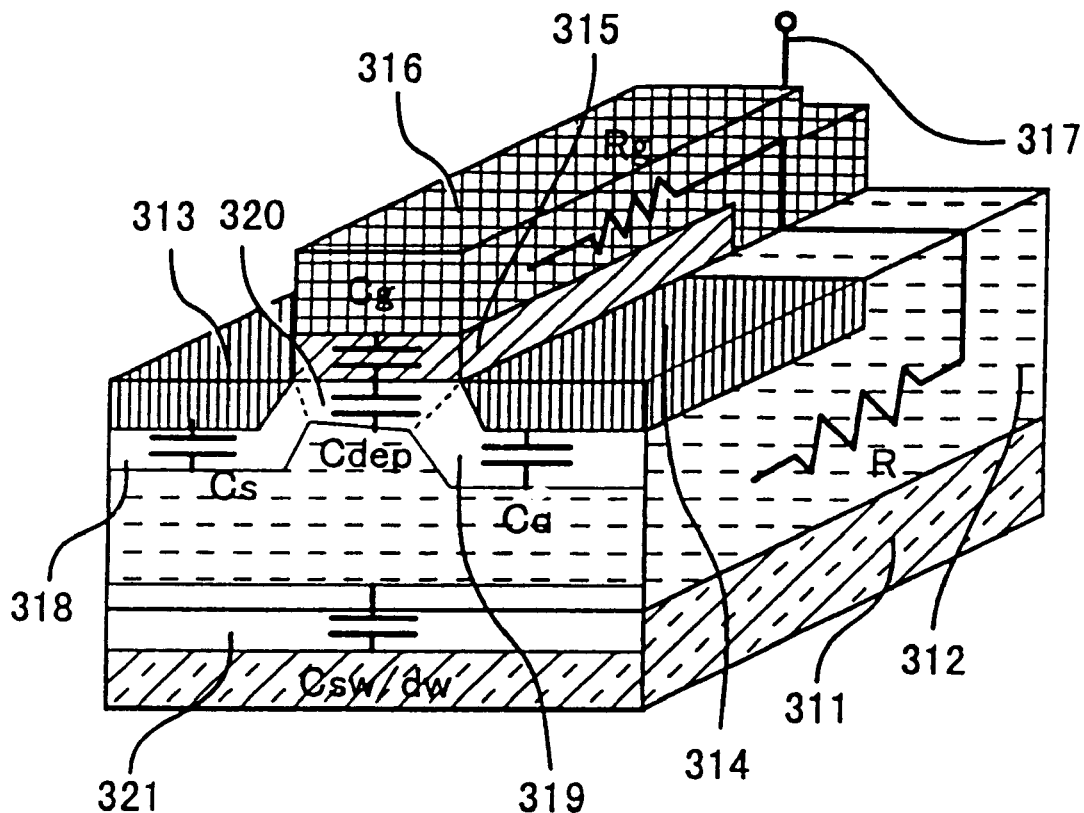
FIG. 29 is a diagram illustrating a conception of a time constant $\tau$ during which a potential provided to a gate electrode is transmitted to a shallow well region.
Figure 29:
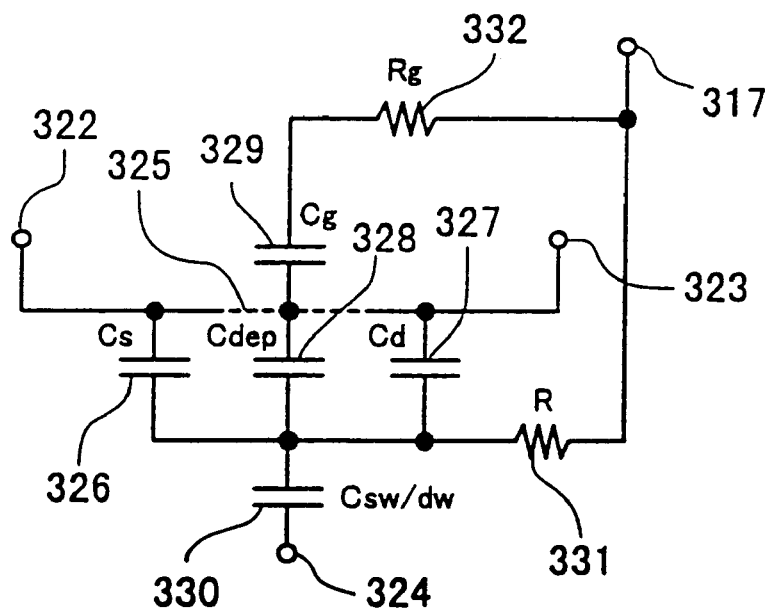

FIG. 26 shows a graphical representation of a delay time per stage of a ring oscillator using a MOSFET produced by the process for producing a semiconductor device of Embodiment 1 or 2 of the present invention. When the operating voltage is 0.5V which is suitable for operating a dynamic threshold voltage transistor using a bulk substrate, the delay time per stage is about $1 \times 10^{-10}$ seconds. This delay time results from the gate capacitance and the wiring capacitance as well as the above-mentioned junction capacitances. Preferably the time constant $\tau$ is sufficiently smaller than this delay time. Therefore, the time constant $\tau$ of the N-type and P-type MOSFET is preferably $5 \times 10^{-11}$ or less.

Embodiment 3

A third embodiment of the present invention is described with reference to FIGS. 21 to 23 as follows.

Figure 21:
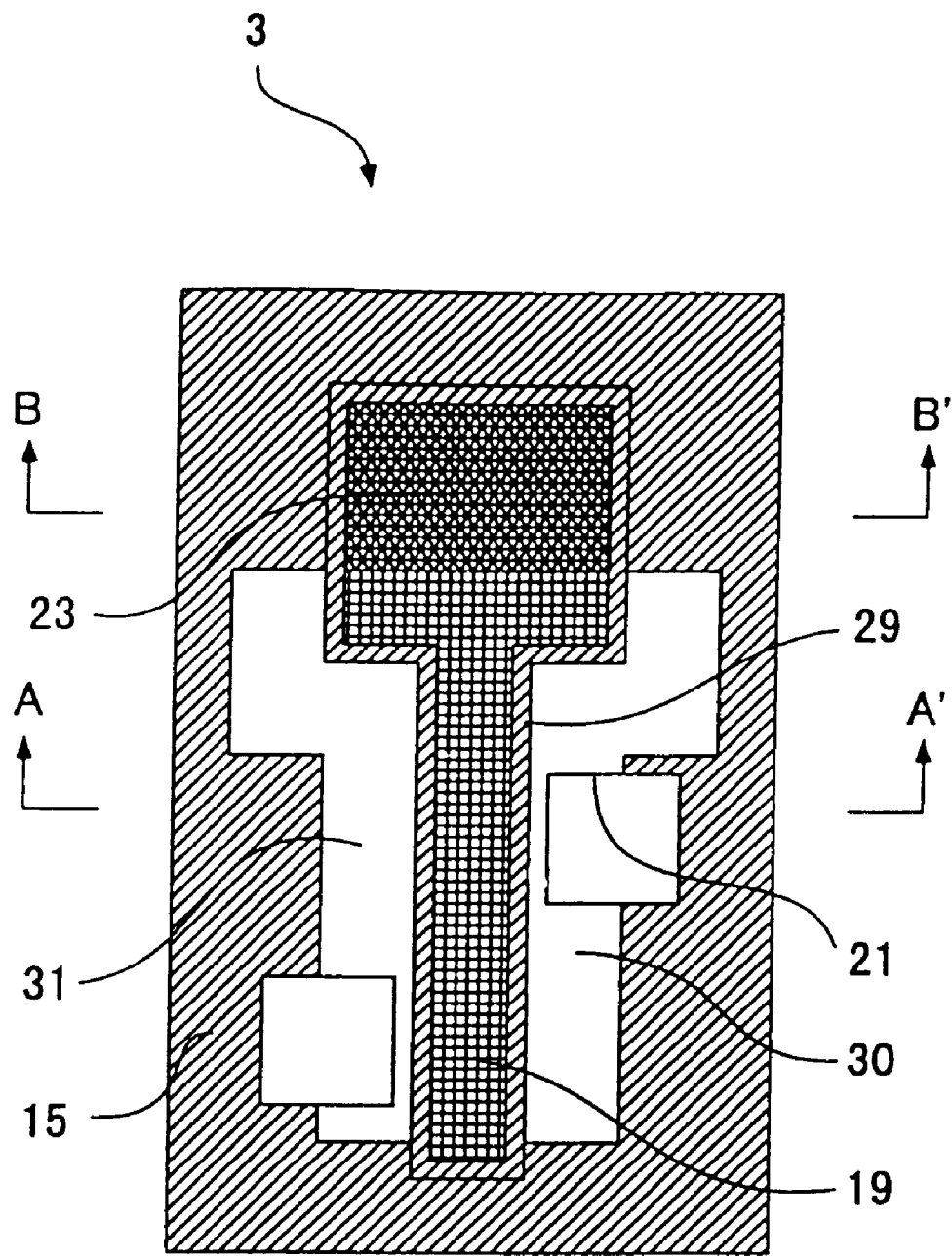
FIG. 21 is a plan view illustrating a semiconductor device produced by a production process in accordance with Embodiment 3 of the present invention.
Figure 22:
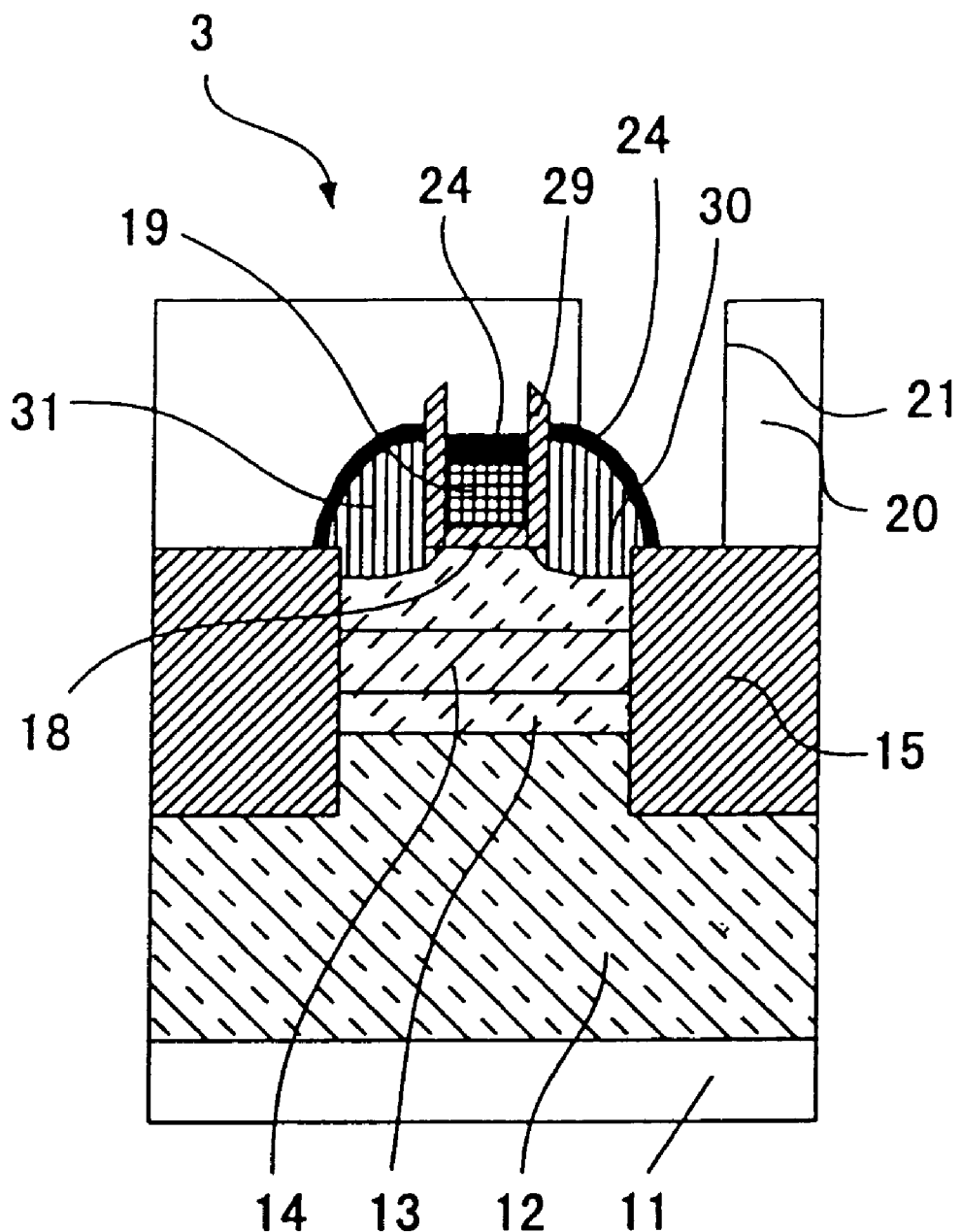
FIG. 22 is a cross-sectional view taken on line A-A' of FIG. 21.
Figure 23:
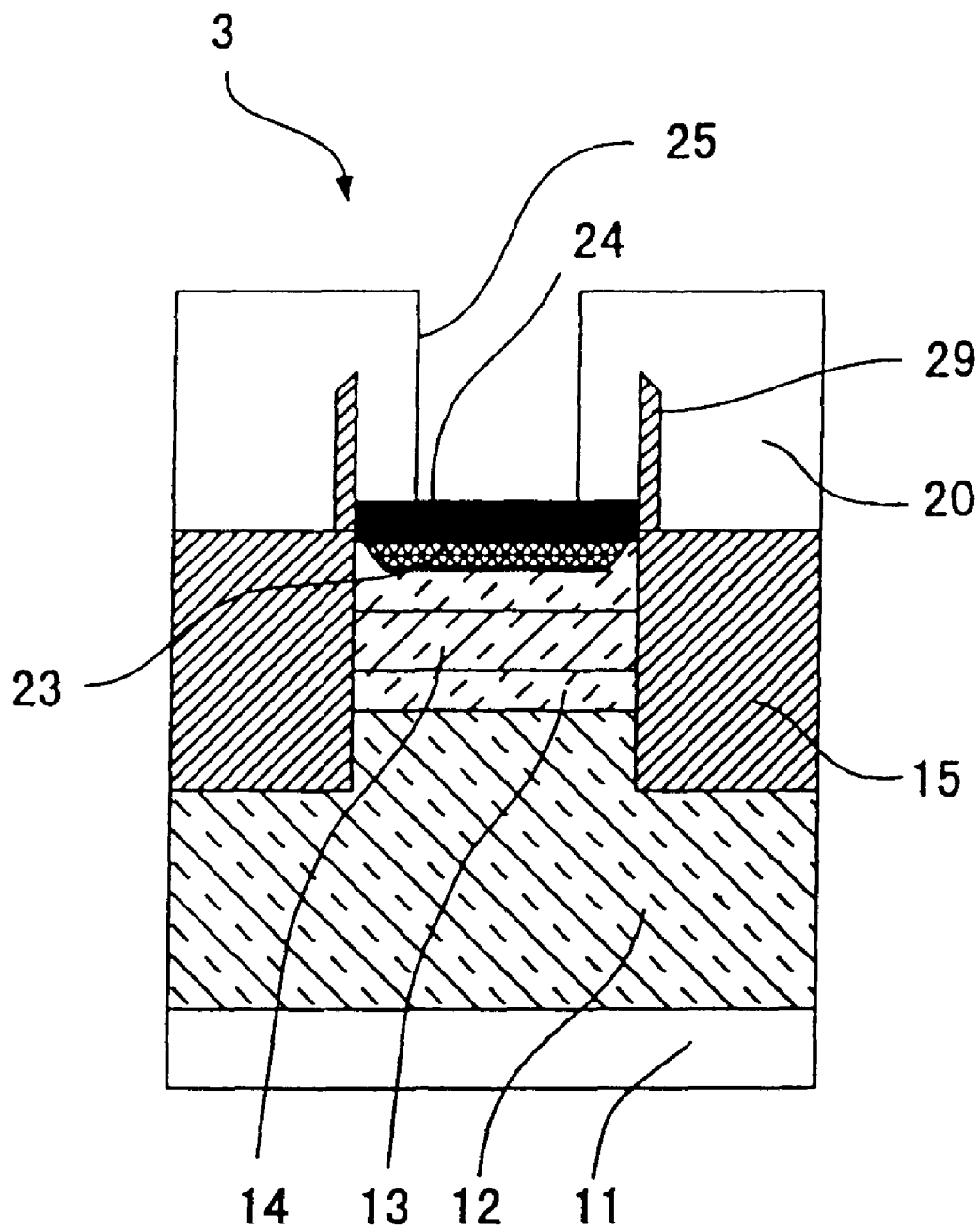
FIG. 23 is a cross-sectional view taken on line B-B' of FIG. 21.

FIGS. 21 to 23 are schematic views illustrating a semiconductor device produced by a production process in accordance with Embodiment 3 of the present invention. FIG. 21 is a plan view, and FIGS. 22 and 23 are cross-sectional views taken on lines A–A' and B–B' of FIG. 21, respectively. It is noted that a silicide region, an interlayer dielectric film and an upper metal wiring are not shown in FIG. 21, and the upper metal wiring is not shown in FIGS. 22 and 23.

This semiconductor device is different form the semiconductor devices of the above-described embodiments in that the source and drain regions are in a stacked form. The process for forming this device is now described.

The device was formed in substantially the same manner as the semiconductor device 1 of the aforesaid embodiment to the formation of the gate electrode. Subsequently, a sidewall spacer 29 of a silicon nitride film was formed on a sidewall of the gate electrode. Further, a sidewall spacer of polysilicon was formed on a sidewall of the sidewall spacer 29. This sidewall spacer of polysilicon was electrically insulated from the gate electrode 19 by the sidewall spacer 29. At this point of time, the sidewall spacer of polysilicon surrounded the gate electrode annularly.

Subsequently, two portions of the sidewall spacer of polysilicon were removed by etching using a mask of a photoresist. Further, the sidewall spacer of polysilicon was subjected to ion implantation for forming a source region and a drain region and annealing for activating the impurity, thereby to form a stacked source region 30 and a stacked drain region 31 in the stacked form.

When the sidewall spacer of polysilicon was etched, part of the gate electrode 19 and the gate oxide film 18 therebeneath were simultaneously removed and the shallow well region 13 was exposed. The impurity ions for forming the source region and the drain region were implanted also into where the shallow well region 13 was exposed, and there a high-concentration region 23 was formed by the later annealing. In this connection, in the case of producing a CMOS transistor, this high-concentration region 23 was of the same conductivity type as that of the shallow well region 13 and was implanted with impurities ions simultaneously when the impurity ions were implanted for forming the source and drain regions of a device of the opposite polarity.

Then, silicide formation was carried out for ohmic contact of the gate electrode 19 with the shallow well region 13. Subsequently, the contacting and metallization steps were conducted in substantially the same manner as the semiconductor device 1 of the above-described embodiment was produced.

By the above-mentioned process, a semiconductor device 3 was formed.

By making the source and drain regions in the stacked form, it has become easier to reduce the depth of the junctions of the source and drain regions with the shallow well region. This is because the impurity diffuses far more quickly in the polysilicon than in the single crystal. This enables an easy production of a device which has a small short-channel effect. Further, the area of the source and drain regions can be reduced greatly.

For example, in the semiconductor device 1 of the aforesaid embodiment, the width of the source and drain regions must be about three times as large as the minimum fabrication width in view of margins for forming contacts.

In contrast, if the source and drain regions are in the stacked form, the width may be reduced to about two-thirds of the minimum fabrication width. Thereby the junction capacitances of the source and drain regions with the shallow well region decrease greatly to about two-ninths. On the other hand, with this construction, the length of the shallow well region in the direction of the gate length is reduced to about one-third as compared with the semiconductor device 1. Accordingly, if the ion implantation for forming the shallow well region is carried out under the same conditions as Embodiments 1 and 2, the resistance of the well will be approximately tripled. However, if the junction capacitances of the source and drain regions with the shallow well region are dominant in C, the time constant $\tau$ decreases in total.

Embodiment 4

A forth embodiment of the present invention is explained with reference to FIGS. 24 to 26 as follows.

Figure 24:
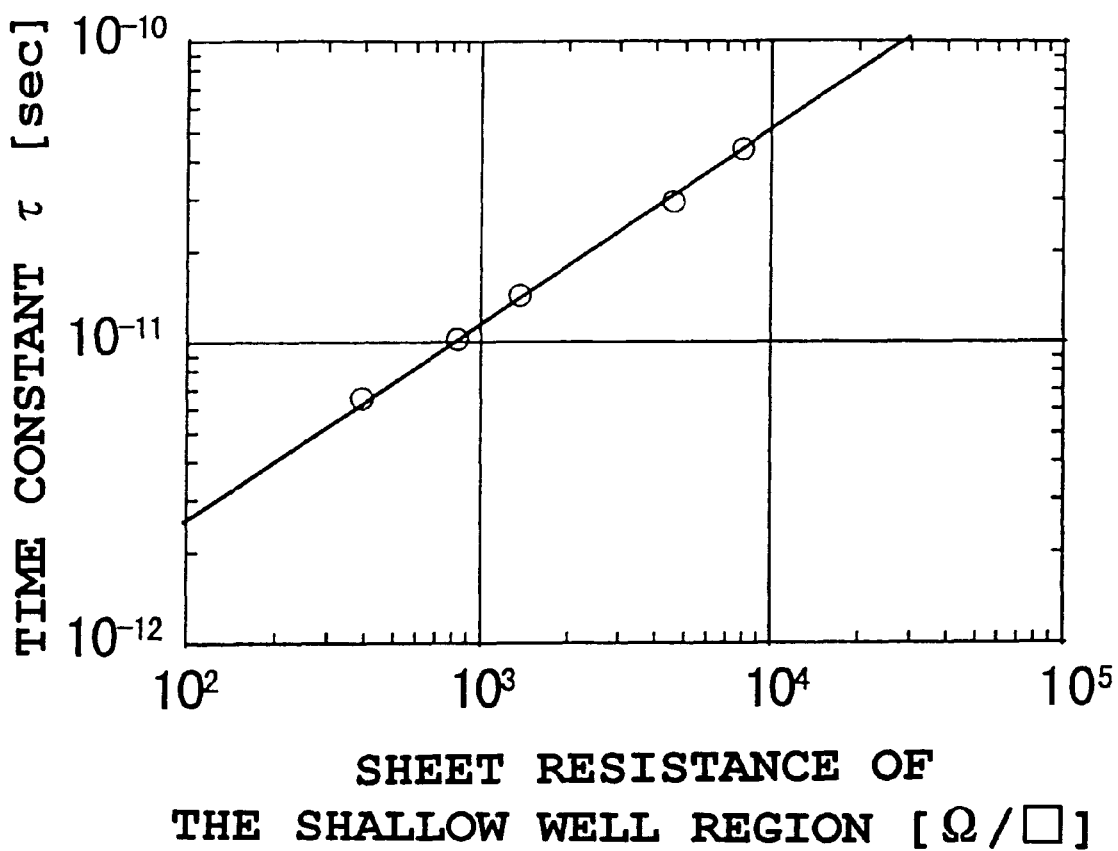
FIG. 24 is a graphical representation showing a relationship of a time constant (which is the product of the sheet resistance of a shallow well region and junction capacitances) with respect to the sheet resistance of the shallow well region in a N-type semiconductor device as shown in FIG. 1.
Figure 25:
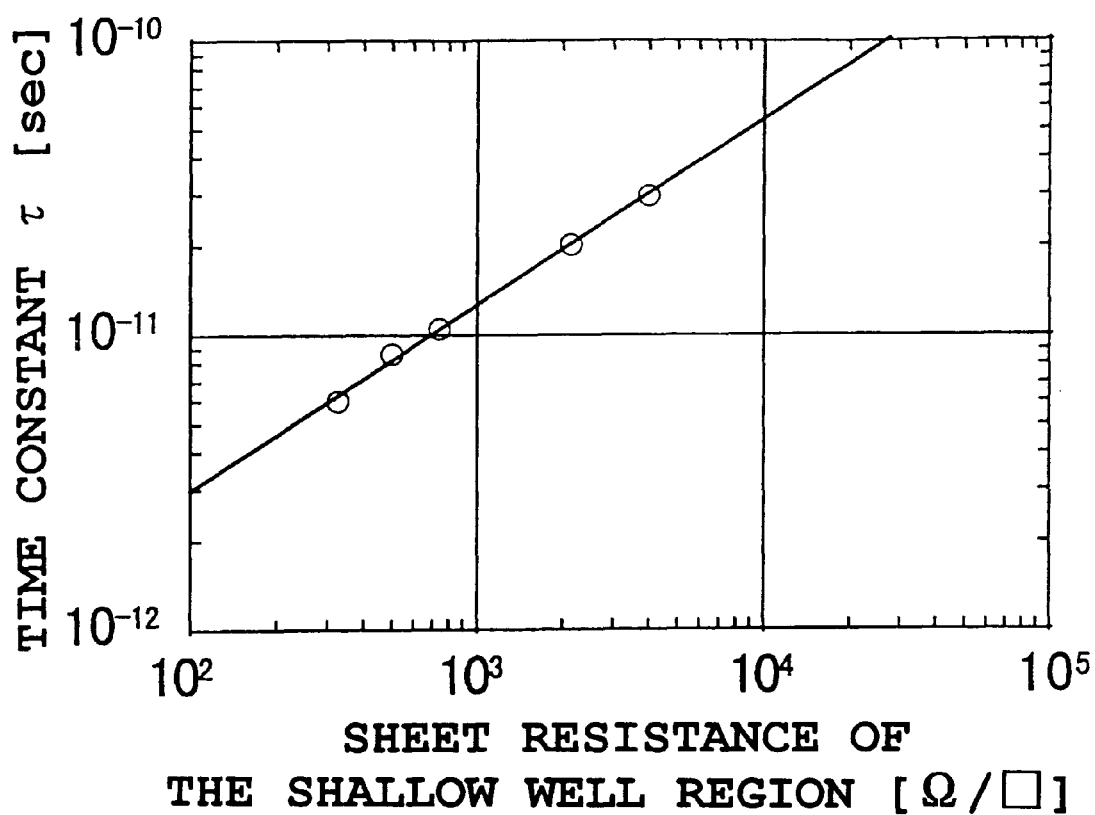
FIG. 25 is a graphical representation showing a relationship of a time constant (which is the product of the sheet resistance of a shallow well region and junction capacitances) with respect to the sheet resistance of the shallow well region in a P-type semiconductor device as shown in FIG. 1.

FIGS. 24 and 25 are graphic representations in which plotted is a time constant (which is the product of junction capacitances and the resistance of the shallow well region) with respect to the sheet resistance of the shallow well region 13 of MOSFET devices produced by the process for producing a semiconductor device of Embodiment 1 or 2 of the present invention. FIG. 24 shows the time constant of a N-type MOSFET and FIG. 25 shows the time constant of a P-type MOSFET. Here, the capacitance C is the sum of the junction capacitance Cs of the source region 16 with the shallow well region 13, the junction capacitance Cd of the drain region 17 with the shallow well region 13, the capacitance Cdep of a gate depletion layer, and the junction capacitance Csw/dw of the shallow well region 13 and the deep well region 12. The product $\tau$ of the junction capacitance C and the resistance R of the shallow well region has a dimension of time, serves as a reference of the time which is required for charging the junction capacitance C when the state of a CMOS circuit transits, and contributes to the whole delay time. Since the capacitance C has an extremely small value in an actual MOSFET device, the capacitance C is obtained by the following method. First, formed are a source region, a drain region, a shallow well region and a deep well region which have the same impurity profile as those of the MOSFET of the invention and have large areas. Each junction capacitance is measured. The measured capacitance is converted in terms of the area of each junction in the actual MOSFET device. Thus the capacitance C is obtained. In FIGS. 24 and 25, the cases of a gate length of 0.25 $\mu$m and a gate width of 2.5 $\mu$m are plotted.

In both the N-type and P-type MOSFET, the time constant $\tau$ increases as the sheet resistance of the shallow well region 13 increases. The time constant $\tau$ is about $5\times10^{-11}$ seconds when the sheet resistance of the shallow well region is 10 K$\Omega$/□. At this time, the resistance R of the shallow well region is about 100 K$\Omega$.

As the dose is increased, the sheet resistance of the shallow well region decreases and the time constant also decreases. But in each case of the P-type and N-type shallow well regions, when the dose of impurity ions reaches $1\times10^{14}$ cm$^{-2}$, the off-leak of the device increases sharply. Accordingly, in devices produced under the conditions of the embodiments, it is preferable that the sheet resistance of the shallow well region is set to 400 to 10,000 $\Omega$/□ in the case of N-type MOSFETs and 300 to 10,000 $\Omega$/□ in the case of P-type MOSFETs. Accordingly, it is understood from FIGS. 24 and 25 that preferably $\tau$ is set to $6\times10^{-12}$ seconds to $5\times10^{-11}$ seconds in a device formed under the conditions of this embodiment. However, if the thermal treatment for forming the shallow well region is combined with the thermal treatment for forming the trench isolation region, lattice defects caused by ion implantation can be recovered and also the resistance of the shallow well region can be reduced.

In devices using the stacked source and drain regions of Embodiment 3, the capacitance C can be greatly reduced as compared with the devices of Embodiments 1 and 2. More particularly, in the devices of Embodiments 1 and 2, the width of the source and drain regions needs to be about three times as large as the minimum fabrication size, while, in the device of Embodiment 3, the width needs to be about two-thirds. If Cdep is negligible as compared with C, C of the device of Embodiment 3 is about two-ninths and R thereof is permitted to be as large as about nine-seconds, as compared with the devices of Embodiments 1 and 2.

Thus the time constant $\tau$, which serves as a reference for time during which a change in the potential of the gate electrode is transmitted to the well region can be sufficiently reduced, the substrate bias effect of the dynamic threshold voltage transistor can be made most of, and high-speed operation at a low operating voltage can be realized.

According to the semiconductor device and the production process therefore of the present invention, it is possible to provide optimal conditions in designing a shallow well region in a dynamic threshold voltage transistor using a bulk substrate. Therefore, there is an effect of reducing the total costs via shortened production process by reduction of device designing costs, reduction of thermal treatments, and reduction of an excess dose of ion implantation and the like.

Also, it is possible to reduce damage to the silicon crystal of the substrate caused by the impurity implantation, and since the depth at which the impurity concentration is highest is sufficiently deeper than the channel, the impurity concentration near the channel can be kept low. Therefore, the reverse and forward leakage currents can be restrained at PN junctions, the off-leak in the MOSFET can be restrained, and a high-performance MOSFET device can be realized which has a low threshold voltage necessary for low-voltage driving.

Furthermore, according to the present invention, it is possible to reduce the CR time constant which is a reference for the time necessary for a change in the potential of the gate electrode to be transmitted in the shallow well region sufficiently as compared with other delay factors such as the gate capacitance, a wiring capacitance and a wiring resistance. Therefore, the substrate bias effect of the dynamic threshold voltage transistor can be taken sufficient advantage, and a high-performance MOSFET device can be realized which is capable of high-speed operation at a low operating voltage.

What is claimed is:

1. A semiconductor device comprising:
   a semiconductor substrate;
   a well region of a first conductivity type formed in the semiconductor substrate;
   a well region of a second conductivity type formed in the semiconductor substrate and on the well region of the first conductivity type;
   a trench isolation region for electrically separating the well region of the second conductivity type from an adjacent well region of the second conductivity type;
   a source region and a drain region of the first conductivity type formed in a surface layer of the well region of the second conductivity type;
   a channel region formed between the source region and the drain region;
   a gate insulating film formed on the channel region; and
   a gate electrode formed on the gate insulating film, being electrically connected to the well region of the second conductivity type,
   wherein the product $\tau$, i.e., CR, of an electrical resistance R of the well region of the second conductivity type and the sum C of junction capacitances between the well region of the second conductivity type and the source region and between the well region of the second conductivity type and the drain region, a junction capacitance between the well region of the second conductivity type and the well region of the first conductivity type and an electrostatic capacitance between the well region of the second conductivity type and an inversion layer formed in the channel region is $5 \times 10^{-11}$ seconds or less.

2. A semiconductor device according to claim 1, wherein $\tau$ is $6 \times 10^{-12}$ to $5 \times 10^{-11}$ seconds.

3. A semiconductor device according to claim 1, wherein the well of the second conductivity type has a sheet resistance of 300 $\Omega/\square$ to 10 K$\Omega/\square$.

4. A semiconductor device comprising:
   a semiconductor substrate;
   a well region of a first conductivity type formed in the semiconductor substrate;
   a well region of a second conductivity type formed in the semiconductor substrate and on the well region of the first conductivity type;
   a trench isolation region for electrically separating the well region of the second conductivity type from an adjacent well region of the second conductivity type;
   a source region and a drain region of the first conductivity type formed in a surface layer of the well region of the second conductivity type;
   a channel region formed between the source region and the drain region;
   a gate insulating film formed on the channel region; and
   a gate electrode formed on the gate insulating film, being electrically connected to the well region of the second conductivity type,
   wherein the well region of the second conductivity type has a sheet resistance of 10 K$\Omega/\square$ or less.

5. A semiconductor device according to claim 4, wherein the source region and the drain region have a stacked structure.

6. A process for producing a semiconductor device as set forth in claim 1, wherein
   a well region of a second conductivity type is formed by an ion implantation step and a thermal treatment step for activating implanted impurity ions,
   (1) the ion implantation step is carried out, after formation of a trench isolation region and before formation of a gate insulating film, under conditions of an implantation energy of 60 KeV to 500 KeV and an implantation dose less than $1 \times 10^{14}$ cm$^{-2}$ in the case where $^{11}$B$^+$ ions are implanted as impurity ions of the second conductivity type, or under conditions of an implantation energy of 130 KeV to 900 KeV and an implantation dose less than $1 \times 10^{14}$ cm$^{-2}$ in the case where $^{31}$P$^+$ ions are implanted as impurity ions of the second conductivity type, and
   (2) the thermal treatment step is carried out simultaneously with a thermal treatment at formation of the gate insulating film and with a thermal treatment at formation of a source region and a drain region.

7. A process for producing a semiconductor device as set forth in claim 1, wherein
   a well region of a second conductivity type is formed by an ion implantation step and a thermal treatment step for activating implanted impurity ions,
   both the ion implantation step and the thermal treatment step are carried out after formation of a trench isolation region and before formation of a gate insulating film,
   (1) the ion implantation step is carried out under conditions of an implantation energy of 60 KeV to 500 KeV and an implantation dose less than $2 \times 10^{14}$ cm$^{-2}$ in the case where $^{11}$B$^+$ ions are implanted as impurity ions of the second conductivity type, or under conditions of an implantation energy of 130 KeV to 900 KeV and an implantation dose less than $2 \times 10^{14}$ cm$^{-2}$ in the case where $^{31}$P$^+$ ions are implanted as impurity ions of the second conductivity type, and
   (2) the thermal treatment step is carried out at a temperature of 900° C. to 1,100° C.

8. A process for producing a semiconductor device as set forth in claim 1, wherein
   a well region of a second conductivity type is formed by an ion implantation step and a thermal treatment step for activating implanted impurity ions,
   (1) the ion implantation step is carried out, before formation of a trench isolation region, under conditions of an implantation energy of 60 KeV to 500 KeV and an implantation dose less than $4 \times 10^{14}$ cm$^{-2}$ in the case where $^{11}$B$^+$ ions are implanted as impurity ions of the second conductivity type, or under conditions of an implantation energy of 130 KeV to 900 KeV and an implantation dose less than $4 \times 10^{14}$ cm$^{-2}$ in the case where $^{31}$P$^+$ ions are implanted as impurity ions of the second conductivity type, and
   (2) the thermal treatment step is carried out simultaneously with a thermal treatment at formation of the trench isolation region which is carried out at a temperature of 1,000° C. to 1,150° C.

9. A process for producing a semiconductor device as set forth in claim 1, wherein a well region of a second conductivity type is formed by an ion implantation step and a thermal treatment step for activating implanted impurity ions, (1) the ion implantation step is carried out, before formation of a trench isolation region, under conditions of an implantation energy of 60 KeV to 500 KeV and an implantation dose less than $1\times10^{14}$ cm$^{-2}$ in the case where $^{11}$B$^+$ ions are implanted as impurity ions of the second conductivity type, or under conditions of an implantation energy of 130 KeV to 900 KeV in an implantation dose less than $1\times10^{14}$ cm$^{-2}$ in the case where $^{31}$P$^+$ ions are implanted as impurity ions of the second conductivity type, and (2) the thermal treatment step is carried out simultaneously with a thermal treatment at formation of the trench isolation region which is carried out at a temperature of 800° C. to 1,000° C.

10. A process according to claim 6, wherein the ion implantation step is carried out under conditions of an implantation energy of 80 KeV to 340 KeV and an implantation dose of $3\times10^{12}$ cm$^{-2}$ to $5\times10^{13}$ cm$^{-2}$ in the case where $^{11}$B$^+$ ions are implanted as impurity ions of the second conductivity type or under conditions of an implantation energy of 200 KeV to 650 KeV and an implantation dose of $3\times10^{12}$ cm$^{-2}$ to $5\times10^{13}$ cm$^{-2}$ in the case where $^{31}$P$^+$ ions are implanted as impurity ions of the second conductivity type.

11. A process according to claim 7, wherein the ion implantation step is carried out under conditions of an implantation energy of 80 KeV to 340 KeV and an implantation dose of $3\times10^{12}$ cm$^{-2}$ to $5\times10^{13}$ cm$^{-2}$ in the case where $^{11}$B$^+$ ions are implanted as impurity ions of the second conductivity type or under conditions of an implantation energy of 200 KeV to 650 KeV and an implantation dose of $3\times10^{12}$ cm$^{-2}$ to $5\times10^{13}$ cm$^{-2}$ in the case where $^{31}$P$^+$ ions are implanted as impurity ions of the second conductivity type.

12. A process according to claim 8, wherein the ion implantation step is carried out under conditions of an implantation energy of 80 KeV to 340 KeV and an implantation dose of $3\times10^{12}$ cm$^{-2}$ to $5\times10^{13}$ cm$^{-2}$ in the case where $^{11}$B$^+$ ions are implanted as impurity ions of the second conductivity type or under conditions of an implantation energy of 200 KeV to 650 KeV and an implantation dose of $3\times10^{12}$ cm$^{-2}$ to $5\times10^{13}$ cm$^{-2}$ in the case where $^{31}$P$^+$ ions are implanted as impurity ions of the second conductivity type.

13. A process according to claim 9, wherein the ion implantation step is carried out under conditions of an implantation energy of 80 KeV to 340 KeV and an implantation dose of $3\times10^{12}$ cm$^{-2}$ to $5\times10^{13}$ cm$^{-2}$ in the case where $^{11}$B$^+$ ions are implanted as impurity ions of the second conductivity type or under conditions of an implantation energy of 200 KeV to 650 KeV and an implantation dose of $3\times10^{12}$ cm$^{-2}$ to $5\times10^{13}$ cm$^{-2}$ in the case where $^{11}$P$^+$ ions are implanted as impurity ions of the second conductivity type.

14. A process according to claim 6, wherein the source region and the drain region have a stacked structure, and the source region and the drain region are formed by forming a sidewall spacer of polysilicon in a desired shape on a sidewall of the gate electrode with intervention of an electrically non-conductive sidewall spacer and implanting impurity ions into the sidewall spacer of polysilicon.

15. A process according to claim 7, wherein the source region and the drain region have a stacked structure, and the source region and the drain region are formed by forming a sidewall spacer of polysilicon in a desired shape on a sidewall of the gate electrode with intervention of an electrically non-conductive sidewall spacer and implanting impurity ions into the sidewall spacer of polysilicon.

16. A process according to claim 8, wherein the source region and the drain region have a stacked structure, and the source region and the drain region are formed by forming a sidewall spacer of polysilicon in a desired shape on a sidewall of the gate electrode with intervention of an electrically non-conductive sidewall spacer and implanting impurity ions into the sidewall spacer of polysilicon.

17. A process according to claim 9, wherein the source region and the drain region have a stacked structure, and the source region and the drain region are formed by forming a sidewall spacer of polysilicon in a desired shape on a sidewall of the gate electrode with intervention of an electrically non-conductive sidewall spacer and implanting impurity ions into the sidewall spacer of polysilicon.

\* \* \* \* \*